(12) United States Patent
Lee et al.

(10) Patent No.: US 12,205,959 B2
(45) Date of Patent: Jan. 21, 2025

(54) DISPLAY DEVICE

(71) Applicant: Samsung Display Co., LTD., Yongin-si (KR)

(72) Inventors: Jong Chan Lee, Suwon-si (KR); Hyun Kim, Seoul (KR); Jeong Su Park, Asan-si (KR); Jeong Kook Wang, Hwaseong-si (KR); Hyun Wook Lee, Suwon-si (KR); Yong Tae Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 432 days.

(21) Appl. No.: 17/550,429

(22) Filed: Dec. 14, 2021

(65) Prior Publication Data

US 2022/0328528 A1 Oct. 13, 2022

(30) Foreign Application Priority Data

Apr. 8, 2021 (KR) ........................ 10-2021-0045658

(51) Int. Cl.
*H01L 27/12* (2006.01)
*H01L 23/00* (2006.01)
(Continued)

(52) U.S. Cl.
CPC .......... *H01L 27/124* (2013.01); *H01L 25/167* (2013.01); *H01L 27/1259* (2013.01);
(Continued)

(58) Field of Classification Search
CPC ............... H01L 25/0753; H01L 27/124; H01L 27/156
See application file for complete search history.

(56) References Cited

U.S. PATENT DOCUMENTS

| 7,250,634 B2 | 7/2007 | Yokoyama et al. |
| 7,615,792 B2 | 11/2009 | Yokoyama et al. |

(Continued)

FOREIGN PATENT DOCUMENTS

| JP | 2019-021676 | 2/2019 |
| KR | 10-0990871 | 10/2010 |

(Continued)

OTHER PUBLICATIONS

International Search Report corresponding to International Application No. PCT/KR2022/004362 dated Jul. 13, 2022.

(Continued)

*Primary Examiner* — Antonio B Crite
(74) *Attorney, Agent, or Firm* — KILE PARK REED & HOUTTEMAN PLLC

(57) ABSTRACT

A display device includes a first electrode and a second electrode spaced apart from each other, each of the first electrode and the second electrode including an electrode base layer, a main electrode layer disposed on the electrode base layer, and an electrode upper layer disposed on a portion of the main electrode layer, a first insulating layer disposed on the first electrode and the second electrode, light-emitting elements disposed on the first electrode and the second electrode on the first insulating layer, a first connecting electrode electrically contacting the light-emitting elements, and a second connecting electrode electrically contacting the light-emitting elements. The first electrode includes a first part, the second electrode includes a second part, and the light-emitting elements are disposed on the first part and the second part.

19 Claims, 25 Drawing Sheets

(51) Int. Cl.
  *H01L 25/075* (2006.01)
  *H01L 25/16* (2023.01)
  *H01L 27/15* (2006.01)
  *H01L 33/38* (2010.01)
  *H01L 33/60* (2010.01)
  *H01L 33/62* (2010.01)

(52) U.S. Cl.
  CPC .............. *H01L 33/60* (2013.01); *H01L 24/24* (2013.01); *H01L 33/38* (2013.01); *H01L 33/62* (2013.01); *H01L 2224/24137* (2013.01); *H01L 2224/24146* (2013.01)

(56) References Cited

U.S. PATENT DOCUMENTS

| | | |
|---|---|---|
| 10,454,070 B2 | 10/2019 | Sakamoto |
| 11,088,126 B2 | 8/2021 | Heo et al. |
| 2014/0361261 A1 | 12/2014 | Choi et al. |
| 2021/0358898 A1 | 11/2021 | Heo et al. |

FOREIGN PATENT DOCUMENTS

| | | | | |
|---|---|---|---|---|
| KR | 10-2014-0143631 | | 12/2014 | |
| KR | 10-2019-0029831 | | 3/2019 | |
| KR | 10-2020-0006209 | | 1/2020 | |
| KR | 10-2020-0017009 | | 2/2020 | |
| KR | 10-2020-0129244 | | 11/2020 | |
| WO | WO-2020145462 A1 | * | 7/2020 | ......... H01L 25/0753 |

* cited by examiner

DISPLAY DEVICE

CROSS-REFERENCE TO RELATED APPLICATION(S)

This application claims priority to and the benefit of Korean Patent Application No. 10-2021-0045658 under 35 U.S.C. § 119, filed on Apr. 8, 2021, in the Korean Intellectual Property Office (KIPO), the entire contents of which are incorporated herein by reference.

BACKGROUND

1. Technical Field

The disclosure relates to a display device.

2. Description of the Related Art

Display devices are becoming more important with developments in multimedia technology. Accordingly, various display devices such as an organic light-emitting diode (OLED) display device, a liquid crystal display (LCD) device, and the like have been used.

Meanwhile, there are self-luminous display devices including light-emitting elements. Examples of the self-luminous display devices include an organic light-emitting display device using an organic material as a light-emitting material or an inorganic light emitting display device using an inorganic material as a light-emitting material.

SUMMARY

Embodiments of the disclosure provide a display device including electrodes having a different stack structure from area to area.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, a display device may comprise a first electrode and a second electrode disposed on a substrate and spaced apart from each other, each of the first electrode and the second electrode including an electrode base layer, a main electrode layer disposed on the electrode base layer, and an electrode upper layer disposed on a portion of the main electrode layer, a first insulating layer disposed on the first electrode and the second electrode, light-emitting elements disposed on the first electrode and the second electrode on the first insulating layer, a first connecting electrode disposed on the first electrode, the first connecting electrode electrically contacting the light-emitting elements, and a second connecting electrode disposed on the second electrode, the second connecting electrode electrically contacting the light-emitting elements, wherein the first electrode may include a first part where the electrode upper layer is not disposed on the main electrode layer, the second electrode may include a second part where the electrode upper layer is not disposed on the main electrode layer, and the light-emitting elements may be disposed on the first part and the second part.

The main electrode layer may include aluminum (Al), and the electrode base layer and the electrode upper layer may include titanium (Ti) or molybdenum (Mo).

In the first part and the second part, the main electrode layer may directly contact the first insulating layer.

The display device may further comprise a first bank pattern disposed between the first electrode and the substrate, and a second bank pattern disposed between the second electrode and the substrate, wherein the first part may be disposed in part on the first bank pattern, and the second part may be disposed in part on the second bank pattern.

The light-emitting elements may be disposed on the first part and the second part, between the first bank pattern and the second bank pattern.

The first insulating layer may include a first contact exposing a part of the electrode upper layer of the first electrode, and a second contact exposing a part of the electrode upper layer of the second electrode, the first connecting electrode may electrically contact the electrode upper layer of the first electrode through the first contact, and the second connecting electrode may electrically contact the electrode upper layer of the second electrode through the second contact.

The display device may further comprise an emission area where the first part and the second part are disposed on the first insulating layer, and a subarea disposed on a side of the emission area, the subarea being an area where the light-emitting elements are not disposed, and a bank layer surrounding the subarea, wherein the first contact and the second contact may be disposed in the subarea, and the first connecting electrode and the second connecting electrode may be disposed across the emission area and the subarea.

The display device may further comprise a via layer disposed between the substrate and the first electrode and between the substrate and the second electrode, and a voltage line and a conductive pattern disposed between the via layer and the substrate, wherein a portion of the first part and a portion of the second part may be disposed directly on the via layer.

The electrode base layer of the first electrode may electrically contact the conductive pattern through a first contact hole penetrating the via layer, and the electrode base layer of the second electrode may electrically contact the voltage line through a second contact hole penetrating the via layer.

The display device may further comprise a bank layer surrounding an emission area where the first part and the second part are disposed on the first insulating layer, wherein the first contact hole and the second contact hole may be disposed to overlap the bank layer.

Sides of the main electrode layer of each of the first electrode and the second electrode may be recessed inwardly from sides of each of the electrode base layer of each of the first electrode and the second electrode and from sides of the electrode upper layer of each of the first electrode and the second electrode.

The via layer may include a crack formed in an area where the first electrode and the second electrode are not disposed, on a top surface of the via layer, and the first insulating layer may overlap the crack.

The first insulating layer may include an organic insulating material.

According to an embodiment of the disclosure, a display device may comprise an emission area and a subarea disposed on a side, in a first direction, of the emission area, a first electrode including a first electrode base layer extending in the first direction, a first main electrode layer disposed on the first electrode base layer, and a first electrode upper layer disposed on part of the first main electrode layer, a second electrode spaced apart from the first electrode in a second direction, the second electrode including a second electrode base layer extending in the first direction, a second main electrode layer disposed on the second electrode base layer, and a second electrode upper layer disposed on part of the second main electrode layer, light-emitting elements disposed on the first electrode and the second electrode in the emission area, a first connecting electrode disposed on the first electrode, the first connecting electrode electrically contacting the light-emitting elements; and a second connecting electrode disposed on the second electrode, the second connecting electrode electrically contacting the light-emitting elements, wherein the first electrode may include a first part where the first electrode upper layer is not disposed in the emission area, the second electrode may include a second part where the second electrode upper layer is not disposed in the emission area, the first connecting electrode may overlap the first part and electrically contact the first electrode upper layer, and the second connecting electrode may overlap the second part of the second electrode and electrically contact the second electrode upper layer.

The first main electrode and the second main electrode layer may include aluminum, and the first electrode base layer, the second electrode base layer, the first electrode upper layer and the second electrode upper layer may include titanium or molybdenum.

The display device may further comprise a first bank pattern partially overlapping the first part of the first electrode and extending in the first direction, and a second bank pattern partially overlapping the second electrode and extending in the first direction, wherein the light-emitting elements may be disposed between the first and second bank patterns.

The display device may further comprise a bank layer including parts that extend in the first direction and parts that extend in the second direction and surrounding the emission area and the subarea, wherein the first electrode and the second electrode may be disposed across the emission area and the subarea.

The first connecting electrode and the second connecting electrode may be disposed across the emission area and the subarea, the first connecting electrode may electrically contact the first electrode upper layer in a first contact disposed in the subarea, and the second connecting electrode may electrically contact the second electrode upper layer in a second contact disposed in the subarea.

The display device may further comprise a first contact hole formed in an area where the first electrode and the bank layer overlap with each other, and a second contact hole formed in an area where the second electrode and the bank layer overlap with each other.

A length, in the first direction, of the first part and the second part may be smaller than a length, in the first direction, of the emission area.

According to the aforementioned and other embodiments of the disclosure, each of electrodes may have a stack of multiple layers, but may not include some of the multiple layers in some areas. The electrodes can effectively reflect light emitted by light-emitting elements, such that the light can be emitted in an upward direction. The electrodes can have a low resistance without causing any contact error even when contacting electrodes from a different layer or with lines.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
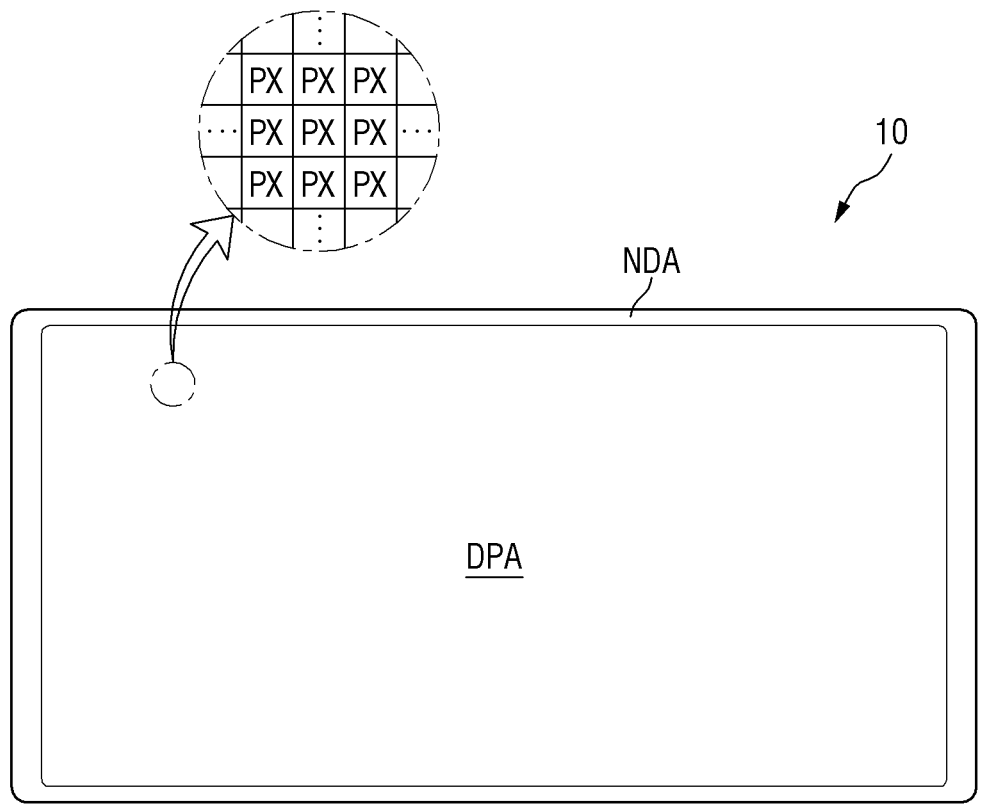
FIG. 1 is a schematic plan view of a display device according to an embodiment of the disclosure.

FIG. 1 is a schematic plan view of a display device according to an embodiment.

Referring to FIG. 1, a display device 10 displays a moving or still image. The display device 10 may refer to nearly all types of electronic devices that provide a display screen. Examples of the display device 10 may include a television (TV), a laptop computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 10 includes a display panel that provides a display screen. Examples of the display panel of the display device 10 include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like. The display panel of the display device 10 will hereinafter be described as being, for example, an ILED display panel, but the disclosure is not limited thereto. For example, various other display panels are also applicable to the display panel of the display device 10.

The shape of the display device 10 may vary. For example, the display device 10 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DPA of the display device 10 may be similar to the shape of the display device 10. FIG. 1 illustrates that the display device 10 has a rectangular shape that extends in a second direction DR2.

The display device 10 may include the display area DPA and a non-display area NDA. The display area DPA may be an area in which an image is displayed, and the non-display area NDA may be an area in which an image is not displayed. The display area DPA may also be referred to as an active area, and the non-display area NDA may also be referred to as an inactive area. The display area DPA may occupy the middle part of the display device 10.

The display area DPA may include pixels PX. The pixels PX may be arranged in row and column directions. The pixels PX may have a rectangular or square shape in a plan view, but the disclosure is not limited thereto. As another example, the pixels PX may have a rhombic shape having sides that are inclined with respect to a particular direction. The pixels PX may be arranged as stripes or islands. Each of the pixels PX may include one or more light-emitting elements emitting light of a particular wavelength range and may thus display a particular color.

The non-display area NDA may be disposed around the display area DPA. The non-display area NDA may surround the entire display area DPA or part of the display area DPA. The display area DPA may have a rectangular shape, and the non-display area NDA may be disposed adjacent to four sides of the display area DPA. The non-display area NDA may form the bezel of the display device 10. Lines or circuit drivers included in the display device 10 may be disposed in the non-display area NDA, or external devices may be mounted in the non-display area NDA.

Figure 2:
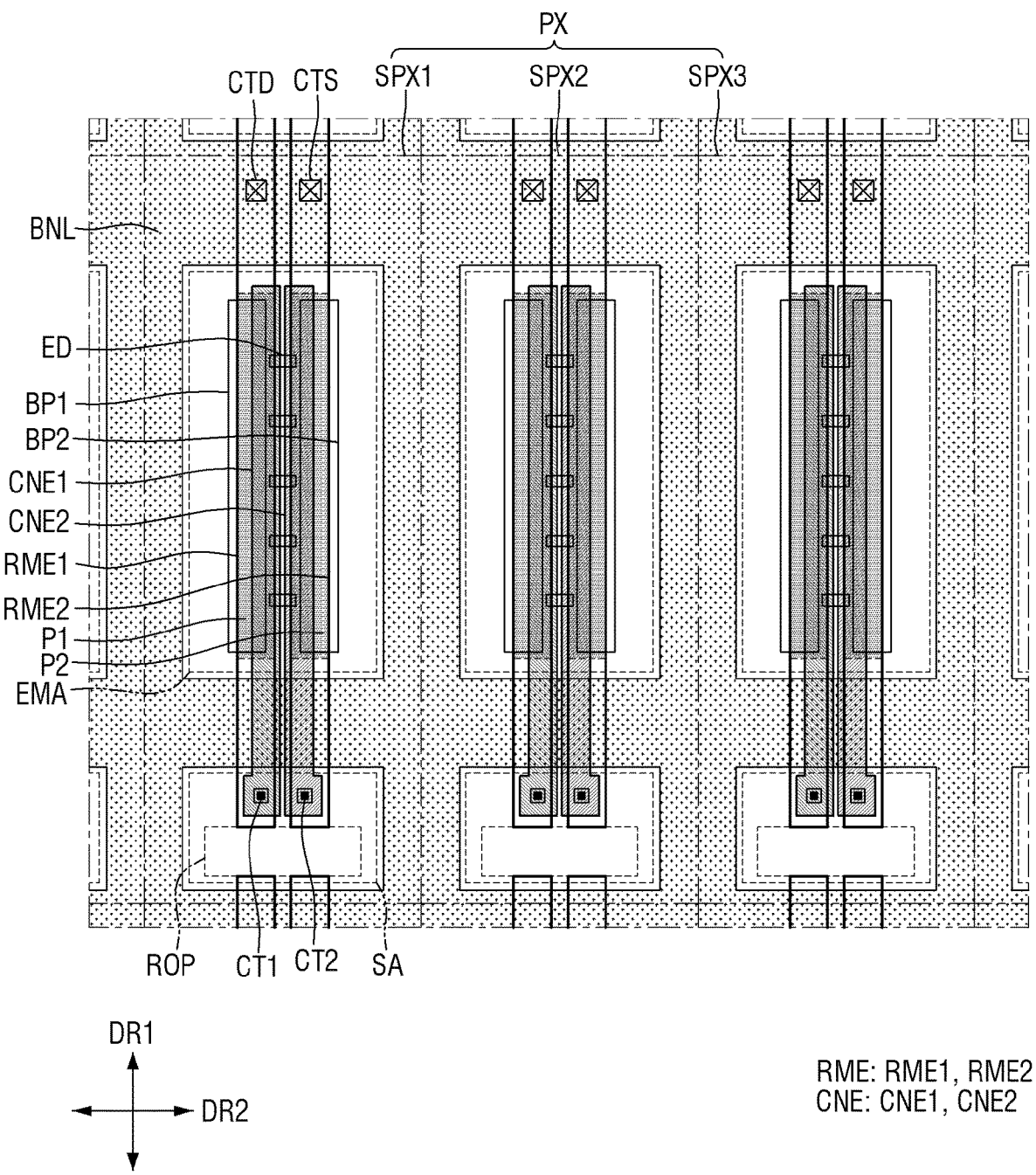
FIG. 2 is a schematic plan view of a pixel of the display device of FIG. 1.

FIG. 2 is a schematic plan view of a pixel of the display device of FIG. 1.

Referring to FIG. 2, a pixel PX of the display device 10 may include subpixels SPXn (where n is an integer of 1 to 3). For example, the pixel PX may include first, second, and third subpixels SPX1, SPX2, and SPX3. The first subpixel SPX1 may emit first-color light, the second subpixel SPX2 may emit second-color light, and the third subpixel SPX3 may emit third-color light. For example, the first-color light, the second-color light, and the third-color light may be blue light, green light, and red light, respectively, but the disclosure is not limited thereto. As another example, the subpixels SPXn may emit light of the same color. For example, the subpixels SPXn may all emit blue light. FIG. 2 illustrates that the pixel PX may include three subpixels SPXn, but the disclosure is not limited thereto. As another example, the pixel PX may include more than three subpixels SPXn.

Each of the subpixels SPXn may include an emission area EMA and a non-emission area. The emission area EMA may be an area that outputs light of a particular wavelength range because of light-emitting elements ED being disposed therein. The non-emission area may be an area which has no light-emitting elements ED disposed therein, is not reached by light emitted by light-emitting elements ED, and thus does not output light.

The emission area EMA may include a region where the light-emitting elements ED are disposed and a region around the light-emitting elements ED where light emitted by the light-emitting elements ED is output. However, the disclosure is not limited thereto. The emission area EMA may also include regions that output light emitted by the light-emitting elements ED is reflected or refracted by other members and output. Light-emitting elements ED may be disposed in each of the subpixels SPXn to form an emission area EMA including a region in which the light-emitting elements ED are disposed and the surroundings of the region in which the light-emitting elements ED are disposed.

FIG. 2 illustrates that the emission areas EMA of the first, second, and third subpixels SPX1, SPX2, and SPX3 have substantially the same size, but the disclosure is not limited thereto. In some embodiments, the emission areas EMA of the subpixels SPXn may have different sizes depending on the color or the wavelength of light emitted by light-emitting elements ED.

Each of the subpixels SPXn may further include a subarea SA which is disposed in the non-emission area of the corresponding subpixel SPXn. In each of the subpixels SPXn, the subarea SA may be disposed on a first side, in a first direction DR1, of the emission area EMA, between the emission area EMA of the corresponding subpixel SPXn and the emission area EMA of another subpixel SPXn adjacent to the corresponding subpixel SPXn in the first direction DR1. For example, emission areas EMA or subareas SA may be repeatedly arranged in a second direction DR2, and the emission areas EMA and the subareas SA may be alternately arranged in the first direction DR1. However, the disclosure is not limited thereto. For example, the emission areas EMA and the subareas SA may have a different layout from that illustrated in FIG. 2.

A bank layer BNL may be disposed between the subareas SA and the emission areas EMA of the subpixels SPXn, and the distance between the subareas SA and the emission areas EMA may vary depending on the width of the bank layer BNL. As no light-emitting elements ED are disposed in the subareas SA, no light may be output from the subareas SA, but electrodes RME may be disposed in part in the subareas SA. Two sets of electrodes RME of two different subpixels SPXn may be separated from each other in a separation part ROP of a subarea SA of one of the two different subpixels SPXn.

The bank layer BNL may include parts that extend in the first direction DR1 and parts that extend in the second direction DR2 and may be arranged in a lattice pattern over the entire display area DPA in a plan view. The bank layer BNL may be disposed along the boundaries of each of the subpixels SPXn to separate the subpixels SPXn from one another. The bank layer BNL may be disposed to surround and separate the emission area EMA and the subarea SA of each of the subpixels SPXn.

Figure 3:
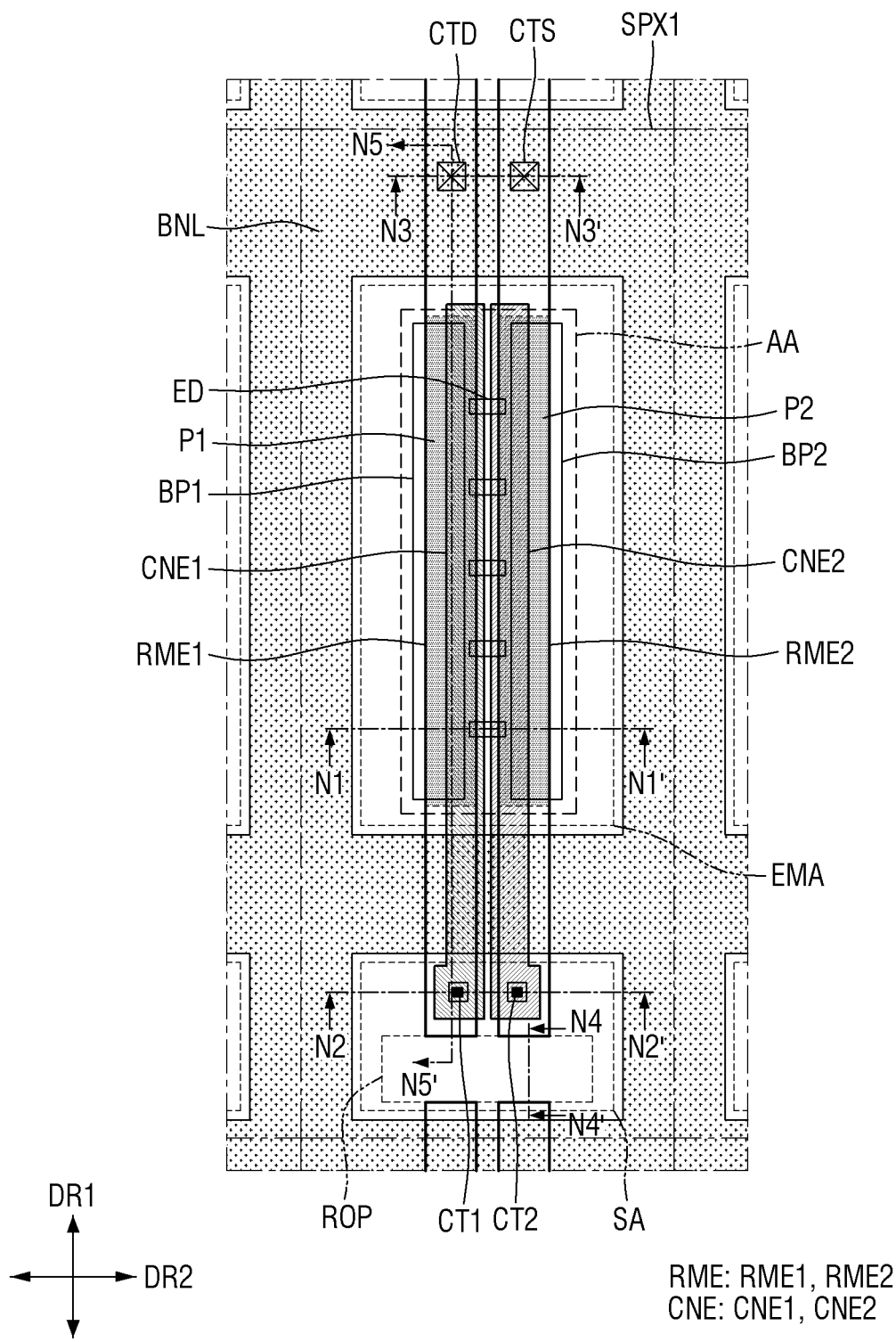
FIG. 3 is a schematic plan view of a first subpixel of FIG. 2.
Figure 4:
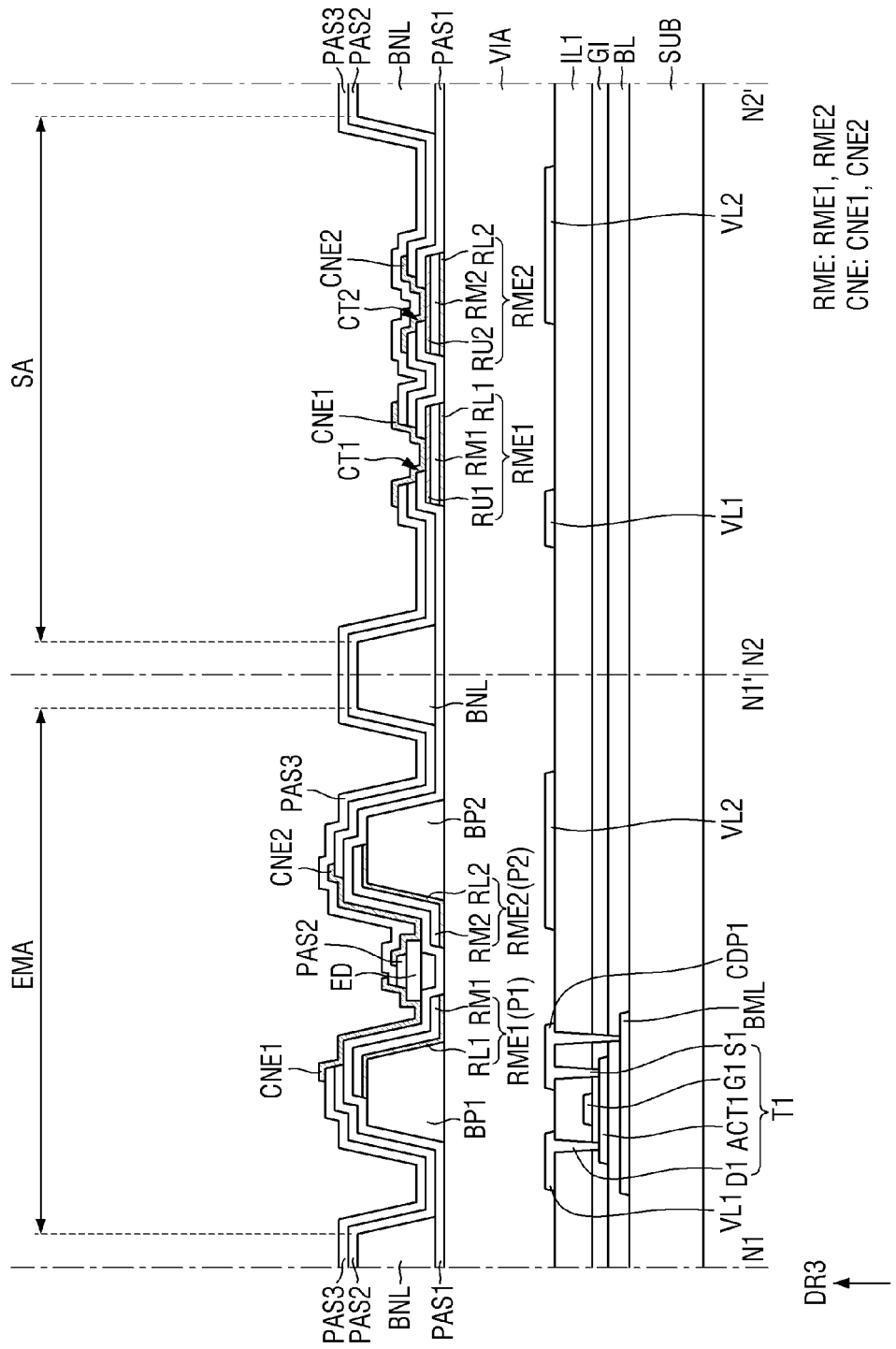
FIG. 4 is a schematic cross-sectional view taken along lines N1-N1' and N2-N2' of FIG. 3.
Figure 5:
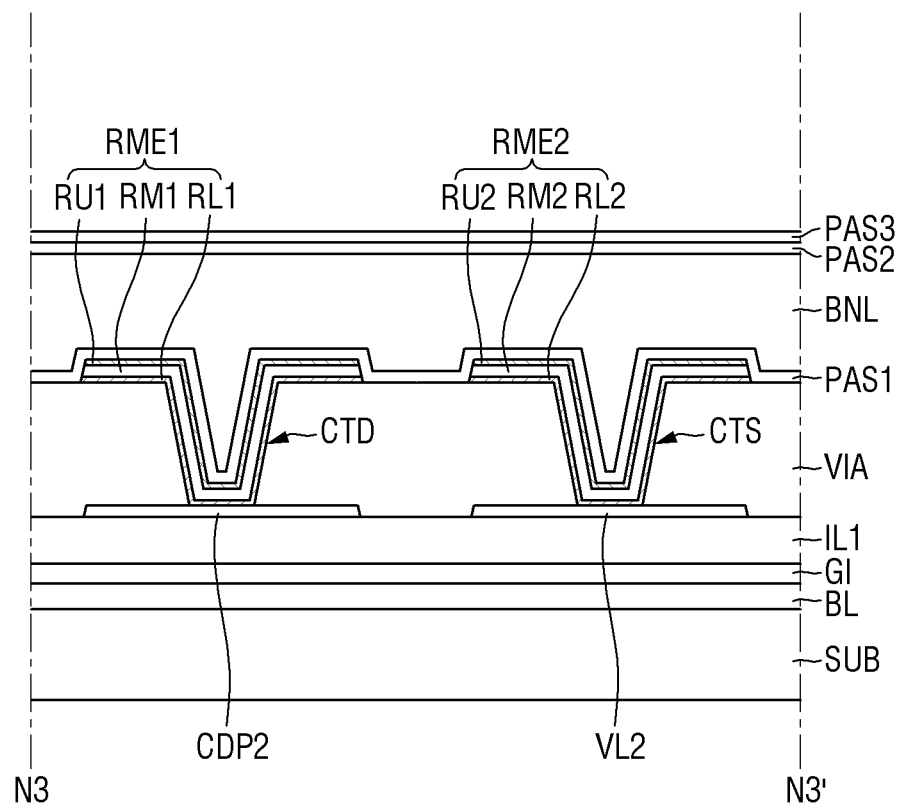
FIG. 5 is a schematic cross-sectional view taken along line N3-N3' of FIG. 3.
Figure 6:
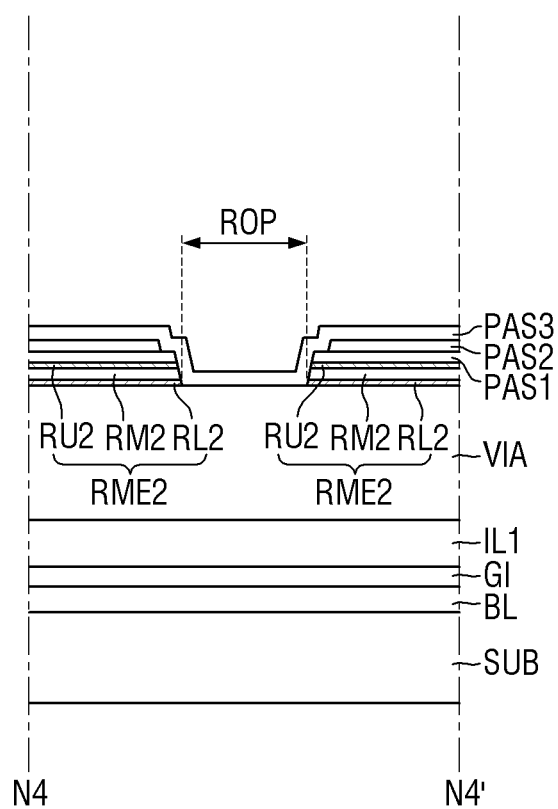
FIG. 6 is a schematic cross-sectional view taken along line N4-N4' of FIG. 3.
Figure 7:
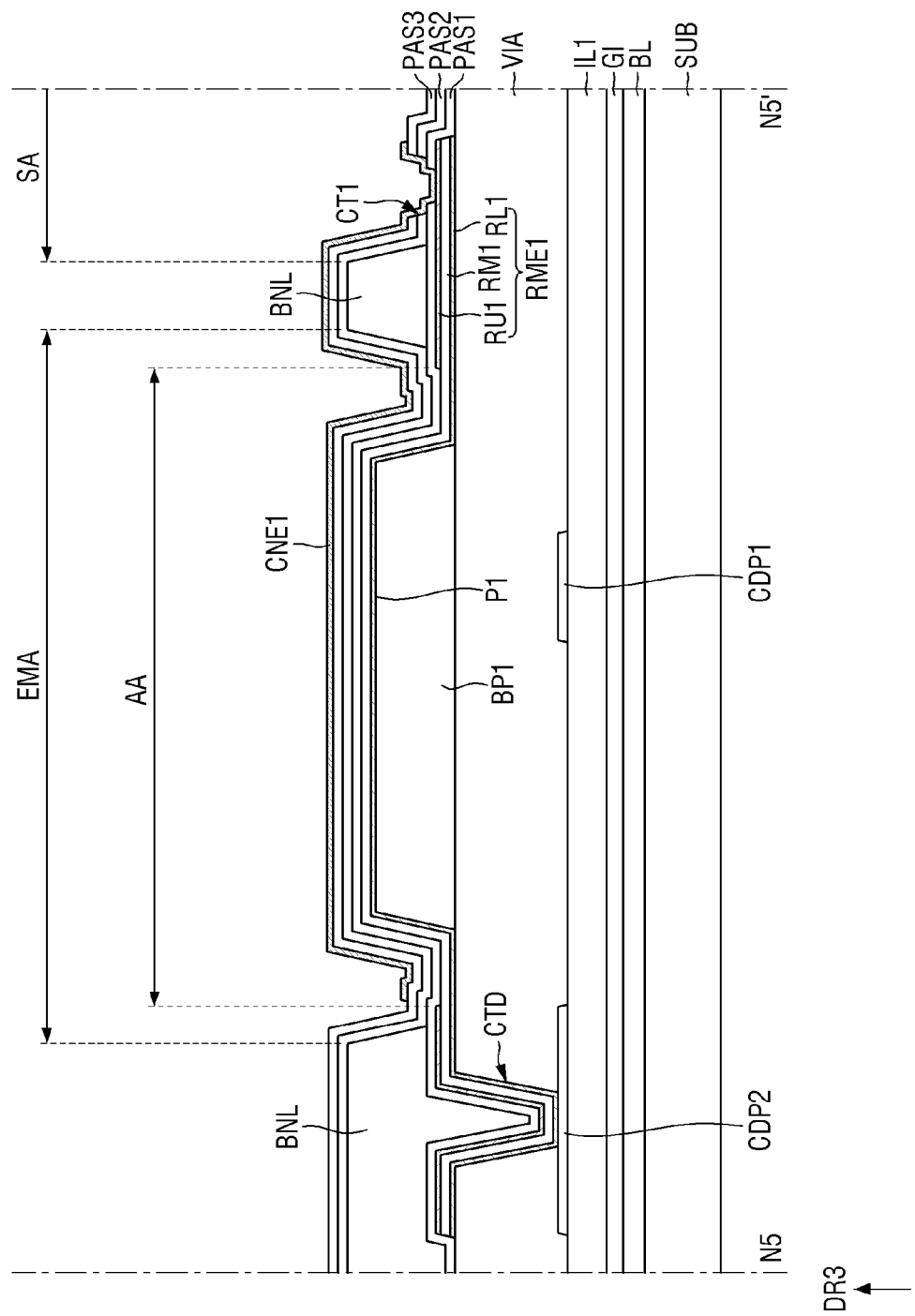
FIG. 7 is a schematic cross-sectional view taken along line N5-N5' of FIG. 3.

FIG. 3 is a schematic plan view of a first subpixel of FIG. 2. FIG. 4 is a schematic cross-sectional view taken along lines N1-N1' and N2-N2' of FIG. 3. FIG. 5 is a schematic cross-sectional view taken along line N3-N3' of FIG. 3. FIG. 6 is a schematic cross-sectional view taken along line N4-N4' of FIG. 3. FIG. 7 is a schematic cross-sectional view taken along line N5-N5' of FIG. 3. FIG. 4 illustrates a schematic cross-sectional view taken across both end portions of a light-emitting element ED in the emission area EMA of FIG. 2 and across first and second contacts CT1 and CT2 in the subarea of FIG. 2, and FIG. 5 illustrates a schematic cross-sectional view taken across first and second contact holes CTD and CTS. FIG. 6 illustrates a schematic cross-sectional view taken across the first electrode of FIG. 2 in the first direction DR1, and FIG. 7 illustrates a schematic cross-sectional view taken across the separation part ROP of the subarea SA of FIG. 2 in the first direction DR1.

Referring to FIGS. 3 to 7, the display device 10 may include, in the first subpixel SPX1, a first substrate SUB and a semiconductor layer, conductive layers, and insulating layers which are disposed on the first substrate SUB. The semiconductor layer, the conductive layers, and the insulating layers may form a circuit layer and a display element layer of the display device 10.

Specifically, the first substrate SUB may be an insulating substrate. The first substrate SUB may be formed of an insulating material such as glass, quartz, or a polymer resin. The first substrate SUB may be a rigid substrate or may be a flexible substrate that is bendable, foldable, or rollable. The first substrate SUB may include a display area DPA and a non-display area NDA which surrounds the display area DPA, and the display area DPA may include an emission area EMA and a subarea SA which is part of a non-emission area.

A first conductive layer may be disposed on the first substrate SUB. The first conductive layer includes a lower metal layer BML, and the lower metal layer BML is disposed to overlap an active layer ACT1 of a first transistor T1. The lower metal layer BML may include a material capable of blocking the transmission of light and may prevent light from being incident upon the active layer ACT1 of the first transistor T1. The lower metal layer BML may not be provided.

A buffer layer BL may be disposed on the lower metal layer BML and the first substrate SUB. The buffer layer BL may be formed on the first substrate SUB to protect the transistors of the first subpixel SPX1 from moisture that may penetrate through the first substrate SUB, which is vulnerable to moisture, and may perform a surface planarization function.

The semiconductor layer is disposed on the buffer layer BL. The semiconductor layer may include the active layer ACT1 of the first transistor T1. The active layer ACT1 may be disposed to partially overlap a gate electrode G1 in a second conductive layer that will be described below.

The semiconductor layer may include polycrystalline silicon, monocrystalline silicon, or an oxide semiconductor. As another example, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zin tin oxide (IZTO), indium gallium tin oxide (IGTO), or indium gallium zinc tin oxide (IGZTO).

FIGS. 3 to 7 illustrate that the first subpixel SPX1 includes a first transistor T1, but the disclosure is not limited thereto. For example, the first subpixel SPX1 may include more than one transistor.

A first gate insulating layer GI is disposed on the semiconductor layer and the buffer layer BL. The first gate insulating layer GI may function as a gate insulating film for the first transistor T1.

A second conductive layer is disposed on the first gate insulating layer GI. The second conductive layer may include a gate electrode G1 of the first transistor T1. The gate electrode G1 may be disposed to overlap the channel region of the active layer ACT1 in a thickness direction, e.g., in a third direction DR3.

A first interlayer insulating layer IL1 is disposed on the second conductive layer. The first interlayer insulating layer IL1 may function as an insulating film between the second conductive layer and layers disposed on the second conductive layer and may protect the second conductive layer.

A third conductive layer is disposed on the first interlayer insulating layer IL1. The third conductive layer may include first and second voltage lines VL1 and VL2 and first and second conductive patterns CDP1 and CDP2 which are disposed in the display area DPA.

A high-potential voltage (or a first power supply voltage) to be transmitted to a first electrode RME1 may be applied to the first voltage line VL1, and a low-potential voltage (or a second power supply voltage) to be transmitted to a second electrode RME2 may be applied to the second voltage line VL2. Part of the first voltage line VL1 may contact the active layer ACT1 of the first transistor T1 through a contact hole that penetrates the first interlayer insulating layer IL1 and the first gate insulating layer GI. The first voltage line VL1 may function as a drain electrode D1 of the first transistor T1. The second voltage line VL2 may be directly electrically connected to the second electrode RME2.

A first conductive pattern CDP1 may contact the active layer ACT1 of the first transistor T1 through a contact hole that penetrates the first interlayer insulating layer IL1 and the first gate insulating layer GI. Also, the first conductive pattern CDP1 may contact the lower metal layer BML through another contact hole. The first conductive pattern CDP1 may function as a source electrode S1 of the first transistor T1.

The second conductive pattern CDP2 may be electrically connected to the first electrode RME1. The second conductive pattern CDP2 may be electrically connected to the first transistor T1 via the first conductive pattern CDP1. FIG. 7 illustrates that the first and second conductive patterns CDP1 and CDP2 are separated from each other, but in another example, the second conductive pattern CDP2 may be integral with the first conductive pattern CDP1 and may thus form a single pattern together with the first conductive pattern CDP1. The first transistor T1 may transmit the first power supply voltage, applied thereto from the first voltage line VL1, to the first electrode RME1.

The first and second conductive patterns CDP1 and CDP2 are illustrated as being formed in the same layer, but the disclosure is not limited thereto. In another example, the second conductive pattern CDP2 may be formed in a different conductive layer from the first conductive pattern CDP1, for example, in a fourth conductive layer disposed on the third conductive layer with a number of insulating layers interposed therebetween. In this case, the first and second voltage lines VL1 and VL2 may be formed in the fourth conductive layer, rather than in the third conductive layer, and the first voltage line VL1 may be electrically connected to the drain electrode D1 of the first transistor T1 via another conductive pattern.

Each of the buffer layer BL, the first gate insulating layer GI, and the first interlayer insulating layer IL1 may be formed of (or include) inorganic layers that are alternately stacked. For example, each of the buffer layer BL, the first gate insulating layer GI, and the first interlayer insulating layer IL1 may be formed as a double-layer in which inorganic layers of at least one of silicon oxide ($SiO_x$), silicon nitride ($SiN_x$), and silicon oxynitride ($SiO_xN_y$) are stacked, or a multi-layer in which such double layers are alternately stacked, but the disclosure is not limited thereto. As another example, each of the buffer layer BL, the first gate insulating layer GI, and the first interlayer insulating layer IL1 may be formed as a single inorganic layer including silicon oxide ($SiO_x$), silicon nitride ($SiN_x$), or silicon oxynitride ($SiO_xN_y$). In some embodiments, the first interlayer insulating layer IL1 may be formed of an organic insulating material such as polyimide (PI).

The second and third conductive layers may be formed as single layers or multi-layers including at least one of molybdenum (Mo), aluminum (Al), chromium (Cr), gold (Au), titanium (Ti), nickel (Ni), neodymium (Nd), copper (Cu), or an alloy thereof, but the disclosure is not limited thereto.

A via layer VIA is disposed on the third conductive layer, in the display area DPA. The via layer VIA may include an organic insulating material such as PI, and may perform a surface planarization function.

Bank patterns (e.g., BP1 and BP2), electrodes RME, the bank layer BNL, light-emitting elements ED, and connecting electrodes CNE (e.g., first and second connecting electrodes CNE1 and CNE2) are disposed on the via layer VIA as the display element layer. First, second, and third insulating layers PAS1, PAS2, and PAS3 may also be disposed on the via layer VIA.

The bank patterns (BP1 and BP2) may be disposed directly on the via layer VIA, in the display area DPA. The bank patterns (BP1 and BP2) may extend in the first direction DR1 and may be spaced apart from one another in the second direction DR2. For example, the bank patterns (BP1 and BP2) may include first and second bank patterns BP1 and BP2, which are spaced apart from each other in the emission area EMA of the first subpixel SPX1. The first bank pattern BP1 may be disposed on a first side, in the second direction DR2, of the center of the emission area EMA, e.g., on the left side of the center of the emission area EMA, and the second bank pattern BP2 may be disposed on a second side, in the second direction DR2, of the center of the emission area EMA, e.g., on the right side of the center of the emission area EMA. The light-emitting elements ED may be disposed between the first and second bank patterns BP1 and BP2.

The length, in the first direction DR1, of the bank patterns (BP1 and BP2) may be smaller than the length, in the first direction DR1, of the emission area EMA surrounded by the bank layer BNL. The bank patterns (BP1 and BP2) may be disposed in the emission area EMA of the first subpixel SPX1, over the entire surface of the display area DPA, to form island patterns that extend in a direction with a relatively small width, but the disclosure is not limited thereto. As another example, each of the bank patterns (BP1 and BP2) may overlap part of the bank layer BNL that extends in the second direction DR2, on both sides thereof in the first direction DR1. FIGS. 3 to 7 illustrate that two bank patterns (BP1 and BP2) having the same width are provided in each subpixel SPXn, but the disclosure is not limited thereto. The number and shape of bank patterns (BP1 and BP2) may vary depending on the number and the pattern of arrangement of electrodes RME.

The bank patterns (BP1 and BP2) may protrude at least in part from the top surface of the via layer VIA. Each of protruding parts of the bank patterns (BP1 and BP2) may have inclined side surfaces, and light emitted by the light-emitting elements ED may be reflected by parts of the electrodes RME on the bank patterns (BP1 and BP2) and BP2 and may thus be emitted in an upward direction with respect to the via layer VIA. However, the disclosure is not limited thereto. As another example, each of the bank patterns (BP1 and BP2) may have a semicircular or semielliptical shape with a curved outer surface. The bank patterns (BP1 and BP2) may include an organic insulating material such as PI, but the disclosure is not limited thereto.

The electrodes RME may be disposed in the first subpixel SPX1 to extend in a direction. The electrodes RME may be disposed in the emission area EMA of the first subpixel SPX1 to extend in the first direction DR1 and be spaced apart from one another in the second direction DR2. The electrodes RME may be electrically connected to the light-emitting elements ED. The electrodes RME may be electrically connected to the light-emitting elements ED through the connecting electrodes CNE that will be described below, and may transmit electrical signals, applied thereto from the underlying conductive layers, to the light-emitting elements ED.

The display device 10 may include the first and second electrodes RME1 and RME2, which are disposed in the first subpixel SPX1. The first electrode RME1 may be disposed on the left side of the center of the emission area EMA of the first subpixel SPX1, and the second electrode RME2 may be disposed on the right side of the center of the emission area EMA of the first subpixel SPX1. The first electrode RME1 may be disposed on the first bank pattern BP1, and the second electrode RME2 may be disposed on the second bank pattern BP2. The first and second electrodes RME1 and RME2 may be disposed in part in the subarea SA of the first subpixel SPX1, beyond the bank layer BNL. The first and second electrodes RME1 and RME2 of the first subpixel SPX1 may be spaced from first and second electrodes RME1 and RME2 of another subpixel SPXn by the separation part ROP in the subarea SA of the first subpixel SPX1.

The first and second electrodes RME1 and RME2 may be disposed at least on inclined side surfaces of the bank patterns (BP1 and BP2). For example, the width, in the second direction DR2, of the electrodes RME may be smaller than the width, in the second direction DR2, of the bank patterns (BP1 and BP2). The first and second electrodes RME1 and RME2 may be disposed to cover (or overlap) at least the side surfaces of the bank patterns (BP1 and BP2) and may thus reflect light emitted by the light-emitting elements ED.

The distance, in the second direction DR2, between the first and second electrodes RME1 and RME2 may be smaller than the distance, in the second direction DR2, between the bank patterns (BP1 and BP2). At least parts of the first and second electrodes RME1 and RME2 may be disposed directly on the via layer VIA to be placed on the same plane.

In an embodiment, the electrodes RME may have a stack of multiple layers having different materials. The electrodes RME may include first and second electrode base layers RL1 and RL2, which are disposed directly on the via layer VIA and the bank patterns (BP1 and BP2), first and second main electrode layers RM1 and RM2 which are disposed on the first and second electrode base layers RL1 and RL2, and first and second electrode upper layers RU1 and RU2, which are disposed in part on the first and second main electrode layers RM1 and RM2. The first electrode RME1 may include the first electrode base layer RL1, the first main electrode layer RM1, and the first electrode upper layer RU1, and the second electrode RME2 may include the second electrode base layer RL2, the second main electrode layer RM2, and the second electrode upper layer RU2.

The first and second electrode base layers RL1 and RL2 and the first and second main electrode layers RM1 and RM2 may be arranged in substantially the same pattern. The first and second electrode base layers RL1 and RL2 and the first and second main electrode layers RM1 and RM2 extend in the first direction DR1, overlapping with one another, the first and second electrode base layers RL1 and RL2 of different electrodes RME may be spaced apart from each other in the second direction DR2, and the first and second main electrode layers RM1 and RM2 of different electrodes RME may be spaced apart from each other in the second direction DR2. The layout of the first and second electrode upper layers RU1 and RU2 may differ from the layout of the first and second electrode base layers RL1 and RL2 and the layout of the first and second main electrode layers RM1 and RM2. The first and second main electrode layers RM1 and RM2 may be disposed directly on the first and second electrode base layers RL1 and RL2, respectively, to cover the first and second electrode base layers RL1 and RL2, respectively. In contrast, the first and second electrode upper layers RU1 and RU2 may be disposed only on parts of the first and second main electrode layers RM1 and RM2, respectively, and parts of the top surfaces of the first and second main electrode layers RM1 and RM2 may directly contact the first insulating layer PAS1.

The electrodes RME may include first and second parts P1 and P2 where the first and second electrode upper layers RU1 and RU2 are not disposed. The first electrode RME1 may include the first part P1, which directly contacts the first insulating layer PAS1 because of the absence of the first electrode upper layer RU1, and the second electrode RME2 may include the second part P2, which directly contacts the first insulating layer PAS1 because of the absence of the second electrode upper layer RU2. The first and second parts P1 and P2 may be parts of the first and second electrodes RME1 and RME2 that reflect light, emitted by the light-emitting elements ED, because of the first and second main electrode layers RM1 and RM2 being exposed, and in the rest of the first and second electrodes RME1 and RME2, the first and second electrode base layers RL1 and RL2 or the first and second electrode upper layers RU1 and Ru2 may directly contact electrodes or patterns of a different layer.

The electrodes RME may be disposed on the bank patterns (BP1 and BP2), and the light-emitting elements ED may be disposed between the bank patterns (BP1 and BP2). The first subpixel SPX1 may include the bank patterns (BP1 and BP2) and an alignment area AA where parts of the electrodes RME on the bank patterns (BP1 and BP2) are located, as a region where the light-emitting elements ED are disposed. The alignment area AA may have a smaller size than the emission area EMA and may be located in a region surrounded by the bank layer BNL. The light-emitting elements ED may be disposed between the bank patterns (BP1 and BP2), in the alignment area AA, and light emitted by the light-emitting elements ED may travel toward the parts of the electrodes RME on the bank patterns (BP1 and BP2). The parts of the electrodes RME on the bank patterns (BP1 and BP2) may have a structure capable of reflecting light emitted by the light-emitting elements ED.

The first and second main electrode layers RM1 and RM2 may include a material with high reflectance, and the parts of the electrodes RME on the bank patterns (BP1 and BP2) may be the first and second parts P1 and P2 where the top surfaces of the first and second main electrode layers RM1 and RM2 are exposed due to the absence of the first and second electrode upper layers RU1 and RU2. The part of the first electrode RME1 on the first bank pattern BP1 may be the first part P1, and in the first part P1, the first main electrode layer RM1 may directly contact the first insulating layer PAS1. The part of the second electrode RME2 on the second bank pattern BP2 may be the second part P2, and in the second part P2, the second main electrode layer RM2 may directly contact the first insulating layer PAS1. In the alignment area AA, the first and second parts P1 and P2 where the first and second electrode upper layers RU1 and RU2 of the first and second electrodes RME1 and RME2 are not disposed, may be located.

Even if the electrodes RME have stacks of the first and second electrode base layers RL1 and RL2, the first and second main electrode layers RM1 and RM2, and the first and second electrode upper layers RU1 and RU2, light from the light-emitting elements ED can be reflected because the top surfaces of the first and second main electrode layers RM1 and RM2, which include a material with high reflectance, are exposed in a region where the light emitted from the light-emitting elements ED is incident. The first and second parts P1 and P2 of the first and second electrodes RME1 and RME2 may be disposed on inclined side surfaces of the bank patterns (BP1 and BP2), and the light emitted from the light-emitting elements ED may be reflected by the first and second main electrode layers RM1 and RM2 and may thus be emitted in an upward direction with respect to the first substrate SUB.

The first and second electrode base layers RL1 and RL2 and the first and second electrode upper layers RU1 and RU2 may include a highly conductive material capable of protecting the first and second main electrode layers RM1 and RM2, but not including Al. For example, the first and second main electrode layers RM1 and RM2 may include an Al-based material or an alloy material including Al, Ni, or lanthanum (La), and the first and second electrode base layers RL1 and RL2 and the first and second electrode upper layers RU1 and RU2 may include a conductive material not including Al, such as Ti, Mo, Cu, ITO, IZO, or ITZO or may include a stack of one or more layers of Ti, Mo, Cu, ITO, IZO, or ITZO. The first and second electrode base layers RL1 and RL2 and the first and second electrode upper layers RU1 and RU2 may include the same material, but the disclosure is not limited thereto. As another example, the first and second electrode base layers RL1 and RL2 and the first and second electrode upper layers RU1 and RU2 may include different materials, in which case, the first and second electrode base layers RL1 and RL2 and the first and second electrode upper layers RU1 and RU2 may not include Al.

The electrodes RME may directly contact the connecting electrodes CNE and the third conductive layer. Electric signals applied to the first and second voltage lines VL1 and VL2 of the third conductive layer may be transmitted to the connecting electrodes CNE and the light-emitting elements ED through the electrodes RME. Parts of the electrodes RME that are more excellent than the first and second main electrode layers RM1 and RM2 in terms of electrical connection and durability may be disposed to directly contact the connecting electrodes CNE and the third conductive layer.

For example, the electrodes RME may extend from the emission area EMA to the subarea SA and may include parts that overlap the bank layer BNL and parts that are disposed in the subarea SA. The first and second main electrode layers RM1 and RM2 may be exposed only in parts of the electrodes RME that are disposed in the alignment area AA of the emission area EMA, e.g., in the first and second parts P1 and P2, and the first and second electrode base layers RL1 and RL2 and the first and second electrode upper layers RU1 and RU2 may be disposed in the parts of the electrodes RME that overlap the bank layer BNL and in the parts of the electrodes RME that are disposed in the subarea SA. The first and second parts P1 and P2 of the electrodes RME where the first and second electrode upper layers RU1 and RU2 are not disposed, may be disposed in the emission area EMA, and the length, in the first direction DR1, of the first and second parts P1 and P2 may be smaller than the length, in the first direction DR1, of the emission area EMA.

Parts of the electrodes RME that are electrically connected to the third conductive layer below the via layer VIA may be the first and second electrode base layers RL1 and RL2, and parts of the electrodes RME that are electrically connected to the connecting electrodes CNE above the first insulating layer PAS1 may be the first and second electrode upper layers RU1 and RU2. The first and second electrode upper layers RU1 and RU2 of the electrodes RME may be exposed through the first and second contacts CT1 and CT2 of the first insulating layer PAS1, in the subarea SA, and the first and second electrode upper layers RU1 and RU2 may directly contact the connecting electrodes CNE. The first and second contacts CT1 and CT2 of the first insulating layer PAS1 where the connecting electrodes CNE contact the first and second electrode upper layers RU1 and RU2 of the electrodes RME may be disposed on the outside of the bank layer BNL with respect to the emission area EMA, but the disclosure is not limited thereto. As another example, the first and second contacts CT1 and CT2 may be located in the emission area EMA.

The first and second electrode base layers RL1 and RL2 may directly contact the third conductive layer through the first and second contact holes CTD and CTS, which penetrate the via layer VIA, in the parts of the electrodes RME that overlap the bank layer BNL. The first contact hole CTD may be formed in a region where the bank layer BNL and the first electrode RME1 overlap each other, and the second contact hole CTS may be formed in a region where the bank layer BNL and the second electrode RME2 overlap each other. The first electrode base layer RL1 of the first electrode RME1 may contact the second electrode pattern CDP2 through the first contact hole CTD, which penetrates the via layer VIA. The second electrode base layer RL2 of the second electrode RME2 may contact the second voltage line VL2 through the second contact hole CTS, which penetrates the via layer VIA. The first electrode RME1 may be electrically connected to the first transistor T1 through the first and second electrode patterns CDP1 and CDP2 and may thus receive the first power supply voltage, and the second electrode RME2 may be electrically connected to the second voltage line VL2 and may thus receive the second power supply voltage.

The first and second main electrode layers RM1 and RM2, which include Al, may have high reflectance for light emitted by the light-emitting elements ED, but may easily be damaged in subsequent processes or exhibit poor electrical connection properties because of the deformation or reaction of Al upon contact with other electrodes. In electrodes RME according to an embodiment, in the region where light emitted by the light-emitting elements ED is reflected, the first and second electrode upper layers RU1 and RU2 are not disposed, and the first and second main electrode layers RM1 and RM2 are exposed. However, in the rest of the electrodes RME, the first and second electrode upper layers RU1 and RU2 cover (or overlap) the first and second main electrode layers RM1 and RM2 and can thus prevent the first and second main electrode layers RM1 and RM2 from being damaged. As the first and second electrode base layers RL1 and RL2 or the first and second electrode upper layers RU1 and RU2 contact electrodes or lines in a different layer, any contact failure can be prevented, and the electrodes RME can have low resistance.

Each of the electrodes RME may be formed of (or include) multiple layers, and the layer that forms the surface of each of the electrodes RME may vary from one location to another location, depending on the layout of the first or second electrode upper layer RU1 or RU2. Thus, the electrodes RME can have sufficient reflectance to reflect light emitted by the light-emitting elements ED, can prevent any contact failure between the connecting electrodes CNE and the third conductive layer, and can have low resistance.

The first and second electrode base layers RL1 and RL2 and the first and second electrode upper layers RU1 and RU2 may be formed by the same patterning process so that each of the electrodes RME may have a single-tapered shape on sides thereof. Sides of the first and second electrode base layers RL1 and RL2 that are opposite to each other and sides of the first and second electrode upper layers RU1 and RU2 that are opposite to each other, may fall on the same plane(s) (or may be coplanar with each other). Referring to FIGS. 4 and 5, in a region where the first and second electrodes RME1 and RME2 are spaced apart from, and face, each other, the sides of the first and second electrode base layers RL1 and RL2 that are opposite to each other and the sides of the first and second electrode upper layers RU1 and RU2 that are opposite to each other may fall on the same plane(s), and as a result, each of the first and second electrodes RME1 and RME2 may have a single-tapered shape because the first and second electrode base layers RL1 and RL2 and the first and second electrode upper layers RU1 and RU2 are formed at the same time by the same patterning process.

The first and second main electrode layers RM1 and RM2 may include a different material from, but may be formed by the same patterning process as, the first and second electrode upper layers RU1 and RU2 and the first and second electrode base layers RL1 and RL2. Thus, sides of the first and second main electrode layers RM1 and RM2 may form a single-tapered shape together with sides of the first and second electrode base layers RL1 and RL2 and sides of the first and second electrode upper layers RU1 and RU2. However, the disclosure is not limited thereto. As another example, the sides of the first and second electrode base layers RL1 and RL2, the sides of the first and second electrode upper layers RU1 and RU2, and the sides of the first and second main electrode layers RM1 and RM2 may form a double-tapered shape.

The first insulating layer PAS1 may be disposed on the via layer VIA and the electrodes RME in the entire display area DPA. The first insulating layer PAS1 may protect the electrodes RME and may insulate the electrodes RME from one another. As before the formation of the bank layer BNL, the first insulating layer PAS1 is disposed to cover (or overlap) the electrodes RME, and thus the electrodes RME can be prevented from being damaged during the formation of the bank layer BNL. The first insulating layer PAS1 can prevent the light-emitting elements ED from being damaged by directly contacting other members.

The first insulating layer PAS1 may be formed to have a recess at the top thereof between the electrodes RME that are spaced apart from each other in the second direction DR2. The light-emitting elements ED may be disposed on recessed parts of the top surface of the first insulating layer PAS1, and gaps may be formed between the first insulating layer PAS1 and the light-emitting elements ED.

The first insulating layer PAS1 may be disposed to cover the electrodes RME and may include openings which expose parts of the top surfaces of the electrodes RME. For example, the first insulating layer PAS1 may include first and second contacts CT1 and CT2 which expose first and second electrode upper layers RU1 and RU2 of the first and second electrodes RME, in the subarea SA. The first contact CT1 may be disposed on the first electrode RME1, in the subarea SA, and the second contact CT2 may be disposed on the second electrode RME2, in the subarea SA. The first and second contacts CT1 and CT2 may be disposed on the outside of the emission area EMA, particularly, on the outside of the bank layer BNL with respect to the emission area EMA, and the connecting electrodes CNE may contact the first and second electrode upper layers RU1 and RU2 of the first and second electrodes RME, on the outside of the bank layer BNL with respect to the emission area EMA. The first insulating layer PAS1 may expose the top surface of the via layer VIA, in the separation part ROP where the electrodes RME are separated from each other.

The bank layer BNL may be disposed on the first insulating layer PAS1. The bank layer BNL may include parts that extend in the first direction DR1 and parts that extend in the second direction DR2 and may surround each subpixel SPXn. The bank layer BNL may surround and separate the emission area EMA and the subarea SA of each subpixel SPXn and may separate the display area DPA and the non-display area NDA by surrounding the outermost parts of the display area DPA. The bank layer BNL may be disposed in the entire display area DPA to form a lattice pattern, and parts of the display area DPA, opened by the bank layer BNL may be the emission area EMA and the subarea SA of each subpixel SPXn.

Similar to the bank patterns BP1 and BP2, the bank layer BNL may have a predetermined height. In some embodiments, the top surface of the bank layer BNL may have a greater height than the bank patterns (BP1 and BP2), and the thickness of the bank layer BNL may be equal to or greater than the thickness of the bank patterns (BP1 and BP2). The bank layer BNL may prevent ink from spilling over between or overflowing into neighboring subpixels SPXn in an inkjet printing process during the fabrication of the display device 10. Similar to the bank patterns (BP1 and BP2), the bank layer BNL may include an organic insulating material such as PI.

The light-emitting elements ED may be disposed on the first insulating layer PAS1. The light-emitting elements ED may extend in a direction, and the direction in which the light-emitting elements ED extend may be parallel to the first substrate SUB. As will be described below, each of the light-emitting elements ED may include semiconductor layers that are arranged in the direction in which the light-emitting elements ED extend. The semiconductor layers may be sequentially arranged in a direction parallel to the top surface of the first substrate SUB, but the disclosure is not limited thereto. As another example, in case that the light-emitting elements ED have a different structure, the semiconductor layers may be arranged in a direction perpendicular to the first substrate SUB.

The light-emitting elements ED may be disposed between each pair of electrodes RME that are spaced apart from each other in the second direction DR2, between the bank patterns (BP1 and BP2). The length of the light-emitting elements ED may be greater than the distance, in the second direction DR2, between the electrodes RME. At least one end portion of each of the light-emitting elements ED may be disposed on one of the electrodes RME, or both end portions of each of the light-emitting elements ED may be disposed on different electrodes RME. As already mentioned above, the first and second parts P1 and P2 of the first and second electrodes RME where the top surfaces of the first and second electrode upper layers RM1 and RM2 are exposed, may be disposed in the alignment area AA, and both end portions of each of the light-emitting elements ED may be disposed on different main electrode layers (e.g., RM1 and RM2) or on different electrode base layers (e.g., RL1 and RL2) depending on the structure of the first and second main electrode layers RM1 and RM2. The light-emitting elements ED may be spaced apart from one another in the direction in which the electrodes RME extend, e.g., in the first direction DR1, and may be aligned substantially parallel to one another, but the disclosure is not limited thereto. As another example, the light-emitting elements ED may be arranged at an inclination with respect to the direction in which the electrodes RME extend.

Different sets of light-emitting elements ED of different subpixels SPXn may emit light of different wavelength ranges depending on the materials of the semiconductor layers thereof, but the disclosure is not limited thereto. As another example, the semiconductor layers of each of the light-emitting elements ED in each subpixel SPXn may include the same material so that the corresponding light-emitting elements ED may emit light of the same color. In the first subpixel SPX1, the light-emitting elements ED may contact the connecting electrodes CNE to be electrically connected to the electrodes RME and the conductive layers below the via layer VIA, and electric signals may be applied to the light-emitting elements ED so that the light-emitting elements ED may emit light of a particular wavelength range. Each of the light-emitting elements ED may emit light through both end portions thereof in the direction in which they extend, and the emitted light may be reflected from first and second main electrode layers RM1 and RM2 on the bank patterns (BP1 and BP2).

The second insulating layer PAS2 may be disposed on the light-emitting elements ED, the first insulating layer PAS1, and the bank layer BNL. The second insulating layer PAS2 may include pattern parts that extend in the first direction DR1 between the bank patterns (BP1 and BP2) and are disposed on the light-emitting elements ED. The pattern parts may be disposed to surround parts of the outer surfaces of each of the light-emitting elements ED and may not cover both sides or both end portions of each of the light-emitting elements ED. The pattern parts may form linear or island patterns in each subpixel SPXn in a plan view. The pattern parts of the second insulating layer PAS2 may protect and fix the light-emitting elements ED during the fabrication of the display device 10. The second insulating layer PAS2 may be disposed to fill the gaps between the second insulating layer PAS2 and the light-emitting elements ED. Parts of the second insulating layer PAS2 may be disposed on the bank layer BNL and in the subarea SA. The part of the second insulating layer PAS2 in the subarea SA may not be disposed in the first and second contacts CT1 and CT2 and in the separation part ROP.

The connecting electrodes CNE may be disposed on and may contact the electrodes RME and the light-emitting elements ED. The connecting electrodes CNE may contact an end portion of each of the light-emitting elements ED and at least one of the electrodes RME through the first and second contacts CT1 and CT2, which penetrate the first and second insulating layers PAS1 and PAS2.

The first connecting electrode CNE1 may extend in the first direction DR1 and may be disposed on the first electrode RME1. Part of the first connecting electrode CNE1 on the first bank pattern BP1 may overlap the first part P1 of the first electrode RME1 and may extend therefrom in the first direction DR1. The first connecting electrode CNE1 may be disposed across the emission area EMA and the subarea SA, beyond the bank layer BNL. The first connecting electrode CNE1 may be disposed in the subarea SA and may contact the first electrode upper layer RU1 through the first contact CT1, which exposes the top surface of the first electrode RME1. The first connecting electrode CNE1 may contact the light-emitting elements ED and the first electrode RME1 and may thus transmit electric signals, applied thereto from the first transistor T1, to the light-emitting elements ED.

The second connecting electrode CNE2 may extend in the first direction DR1 and may be disposed on the second electrode RME2. Part of the second connecting electrode CNE2 on the second bank pattern BP2 may overlap the second part P2 of the second electrode RME2 and may extend therefrom in the first direction DR1. The second connecting electrode CNE2 may be disposed across the emission area EMA and the subarea SA, beyond the bank layer BNL. The second connecting electrode CNE2 may be disposed in the subarea SA and may contact the second electrode upper layer RU2 through the second contact CT2, which exposes the top surface of the second electrode RME2. The second connecting electrode CNE2 may contact the light-emitting elements ED and the second electrode RME2 and may thus transmit electric signals applied thereto from the second voltage line VL2 to the light-emitting elements ED.

The third insulating layer PAS3 is disposed on the second connecting electrode CNE1 and the second insulating layer PAS2. The third insulating layer PAS3 may be disposed on the entire surface of the second insulating layer PAS2 to cover the second connecting electrode CNE2, and the first connecting electrode CNE1 may be disposed on the third insulating layer PAS3. The third insulating layer PAS3 may be disposed on the entire surface of the via layer VIA except for a region where the second connecting electrode CNE2 is disposed. The third insulating layer PAS3 may insulate the first connecting electrode CNE1 from the second connecting electrode CNE2 so that the first and second connecting electrodes CNE1 and CNE2 may not directly contact each other.

The third insulating layer PAS3 may be disposed in the entire subarea except for a region where the first contact CT1 is disposed, and may cover the second contact CT2 and the separation part ROP. As the first connecting electrode CNE1 is disposed in the first contact CT1, the third insulating layer PAS3 may expose the first contact CT1. As the second connecting electrode CNE2 is disposed in the second contact CT2, the third insulating layer PAS3 may cover not only the second connecting electrode CNE2, but also the second contact CT2. As the third insulating layer PAS3 covers the separation part ROP, the electrodes RME may directly contact part of the top surface of the via layer VIA, exposed therebetween.

Although not specifically illustrated, an additional insulating layer may be further disposed on the third insulating layer PAS3 and the first connecting electrode CNE1. The additional insulating layer may protect the elements, disposed on the first substrate SUB, from an external environment.

The first, second, and third insulating layers PAS1, PAS2, and PAS3 may include an inorganic insulating material or an organic insulating material.

Figure 8:
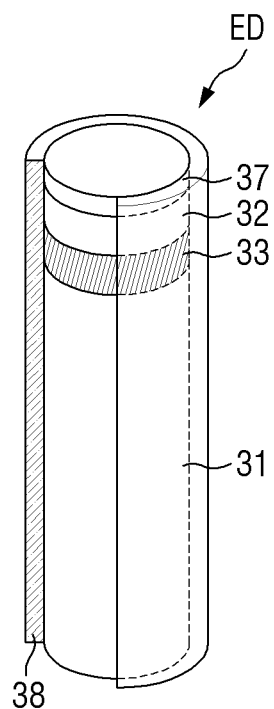
FIG. 8 is a schematic perspective view of a light-emitting element according to an embodiment of the disclosure.

FIG. 8 is a schematic perspective view of a light-emitting element according to an embodiment.

Referring to FIG. 8, a light-emitting element ED may be a light-emitting diode (LED), particularly, an ILED having a size of several nanometers or micrometers and may be formed of an inorganic material. If an electric field is formed in a particular direction between two opposite electrodes, the light-emitting element ED may be aligned between the two electrodes where polarities are formed.

The light-emitting element ED may extend in a direction. The light-emitting element ED may have the shape of a cylinder, a rod, a wire, or a tube, but the shape of the light-emitting element ED is not particularly limited. As another example, the light-emitting element ED may have the shape of a polygonal column such as a regular cube, a rectangular parallelepiped, or a hexagonal column or may extend in a direction and have a partially inclined outer surface.

The light-emitting element ED may include semiconductor layers doped with impurities of an arbitrary conductivity type (e.g., a p type or an n type). The semiconductor layers may receive electrical signals from an external power source to emit light of a particular wavelength range. The light-emitting element ED may include a first semiconductor layer 31, a second semiconductor layer 32, a light-emitting layer 33, an electrode layer 37, and an insulating film 38.

The first semiconductor layer 31 may include an n-type semiconductor. The first semiconductor layer 31 may include a semiconductor material, e.g., $Al_xGa_yIn_{1-x-y}N$ (where $0 \leq x \leq 1$, $0 \leq y \leq 1$, and $0 \leq x+y \leq 1$). For example, the first semiconductor layer 31 may include at least one of AlGaInN, GaN, AlGaN, InGaN, AlN, and InN that are doped with an n-type dopant. The n-type dopant may be Si, Ge, or Sn.

The second semiconductor layer 32 may be disposed on the first semiconductor layer 31 with the light-emitting layer 33 interposed therebetween. The second semiconductor layer 32 may include a p-type semiconductor. The second semiconductor layer 32 may include a semiconductor material, e.g., $Al_xGa_yIn_{1-x-y}N$ (where 0≤x≤1, 0≤y≤1, and 0≤x+y≤1). For example, the second semiconductor layer 32 may include at least one of AlGaInN, GaN, AlGaN, InGaN, AlN, and InN that are doped with a p-type dopant. The p-type dopant may be Mg, Zn, Ca, Se, or Ba.

FIG. 8 illustrates that the first and second semiconductor layers 31 and 32 are formed as single layers, but the disclosure is not limited thereto. As another example, each of the first and second semiconductor layers 31 and 32 may include more than one layer such as a clad layer or a tensile strain barrier reducing (TSBR) layer, depending on the material of the light-emitting layer 33.

The light-emitting layer 33 may be disposed between the first and second semiconductor layers 31 and 32. The light-emitting layer 33 may include a single- or multi-quantum well structure material. In case that the light-emitting layer 33 includes a material having a multi-quantum well structure, the light-emitting layer 33 may have a structure in which multiple quantum layers and multiple well layers are alternately stacked. The light-emitting layer 33 may emit light by combining electron-hole pairs in accordance with electrical signals applied thereto via the first and second semiconductor layers 31 and 32. The light-emitting layer 33 may include a material such as AlGaN or AlGaInN. In particular, in a case where the light-emitting layer 33 has a multi-quantum well structure in which multiple quantum layers and multiple well layers are alternately stacked, the quantum layers may include a material such as AlGaN or AlGaInN, and the well layers may include a material such as GaN or AlInN.

The light-emitting layer 33 may have a structure in which a semiconductor material having a large band gap energy and a semiconductor material having a small band gap energy are alternately stacked or may include group III or V semiconductor materials depending on the wavelength of light to be emitted. The type of light emitted by the light-emitting layer 33 is not particularly limited. In some embodiments, the light-emitting layer 33 may emit light of a red or green wavelength range, instead of blue light.

The electrode layer 37 may be an ohmic connecting electrode, but the disclosure is not limited thereto. As another example, the electrode layer 37 may be a Schottky connecting electrode. The light-emitting element ED may include at least one electrode layer 37. The light-emitting element ED may include more than one electrode layer 37, but the disclosure is not limited thereto. As another example, the electrode layer 37 may not be provided.

The electrode layer 37 may reduce the resistance between the light-emitting element ED and electrodes RME (or connecting electrodes CNE) in case that the light-emitting element ED is electrically connected to the electrodes RME (or the connecting electrodes CNE). The electrode layer 37 may include a conductive metal. For example, the electrode layer 37 may include at least one of Al, Ti, In, gold (Au), Ag, ITO, IZO, and ITZO.

The insulating film 38 may be disposed to surround the first and second semiconductor layers 31 and 32 and the electrode layer 37. For example, the insulating film 38 may be disposed to surround at least the light-emitting layer 33, but to expose both end portions, in the length direction, of the light-emitting element ED. The insulating film 38 may be formed such that the top surface thereof is rounded in a region adjacent to at least an end of the light-emitting element ED in a cross-sectional view.

The insulating film 38 may include a material with insulating properties such as silicon oxide ($SiO_x$), silicon nitride ($SiN_x$), silicon oxynitride ($SiO_xN_y$), aluminum nitride ($AlN_x$), or aluminum oxide ($AlO_x$). The insulating film 38 is illustrated as being a single-layer film, but the disclosure is not limited thereto. As another example, in some embodiments, the insulating film 38 may be formed as a multi-layer film in which multiple layers are stacked.

The insulating film 38 may protect the other elements of the light-emitting element ED. The insulating film 38 can prevent any short circuit that may occur in the light-emitting element 33 in case that the light-emitting element ED directly contacts electrodes to which electrical signals are applied. The insulating film 38 can prevent the degradation of the emission efficiency of the light-emitting element ED.

The outer surface of the insulating film 38 may be subjected to surface treatment. The light-emitting element ED may be sprayed on electrodes while being dispersed in ink. The surface of the insulating film 38 may be hydrophobically or hydrophilically treated to keep the light-emitting element ED dispersed in ink without agglomerating with other neighboring light-emitting elements ED.

It will hereinafter be described how to fabricate the display device 10 with reference to FIGS. 9 to 17.

FIGS. 9 to 17 are schematic cross-sectional views illustrating a method of fabricating a display device according to an embodiment.

FIGS. 9 to 17 are schematic cross-sectional views illustrating the order in which layers in a subpixel SPXn of the display device 10 are formed. Specifically, FIGS. 9 to 17 illustrate the order in which layers of each of electrodes RME in an emission area EMA and a subarea SA of a subpixel SPXn are formed, and the structures illustrated in FIGS. 9 to 17 correspond to the structure illustrated in FIG. 4. The layers of each of the electrodes RME may be formed by a typical patterning process. Thus, descriptions of how to form the layers of each of the electrodes RME will be omitted or simplified, and the order in which to form the layers of each of the electrodes RME will hereinafter be described.

Figure 9:
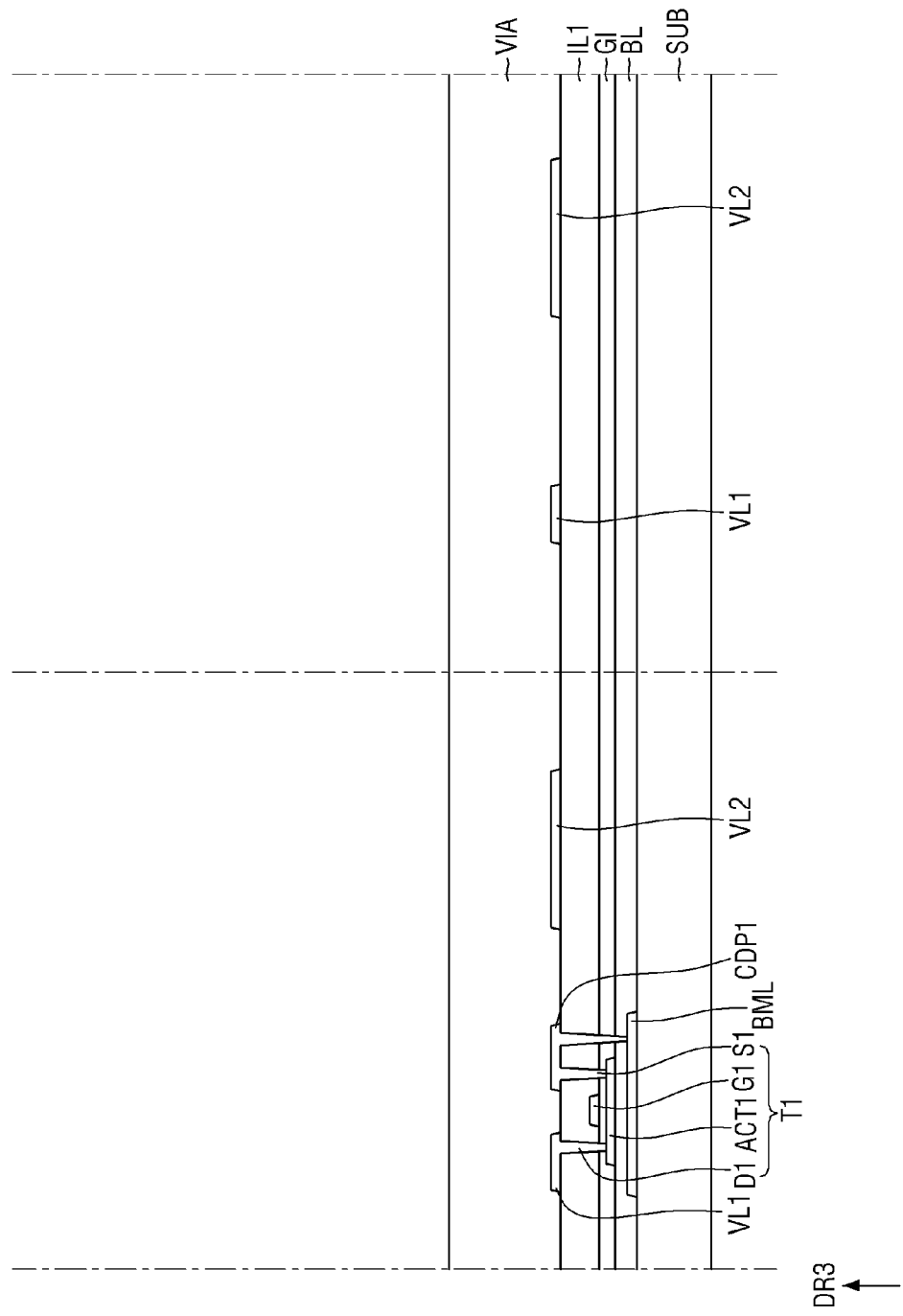
FIGS. 9 to 17 are schematic cross-sectional views illustrating a method of fabricating a display device according to an embodiment of the disclosure.

Referring first to FIG. 9, a first substrate SUB is provided, and first, second, and third conductive layers, a buffer layer BL, a first gate insulating layer GI, a first interlayer insulating layer ILL and a via layer VIA are formed on the first substrate SUB. Each of the first, second, and third conductive layers disposed on the first substrate SUB may be formed by depositing a predetermined material such as a metallic material and patterning the metallic material using a mask. Each of the buffer layer BL, the first gate insulating layer GI, the first interlayer insulating layer IL1, and the via layer VIA may be formed by applying a predetermined material such as an insulating material and patterning the insulating material using a mask.

Figure 10:
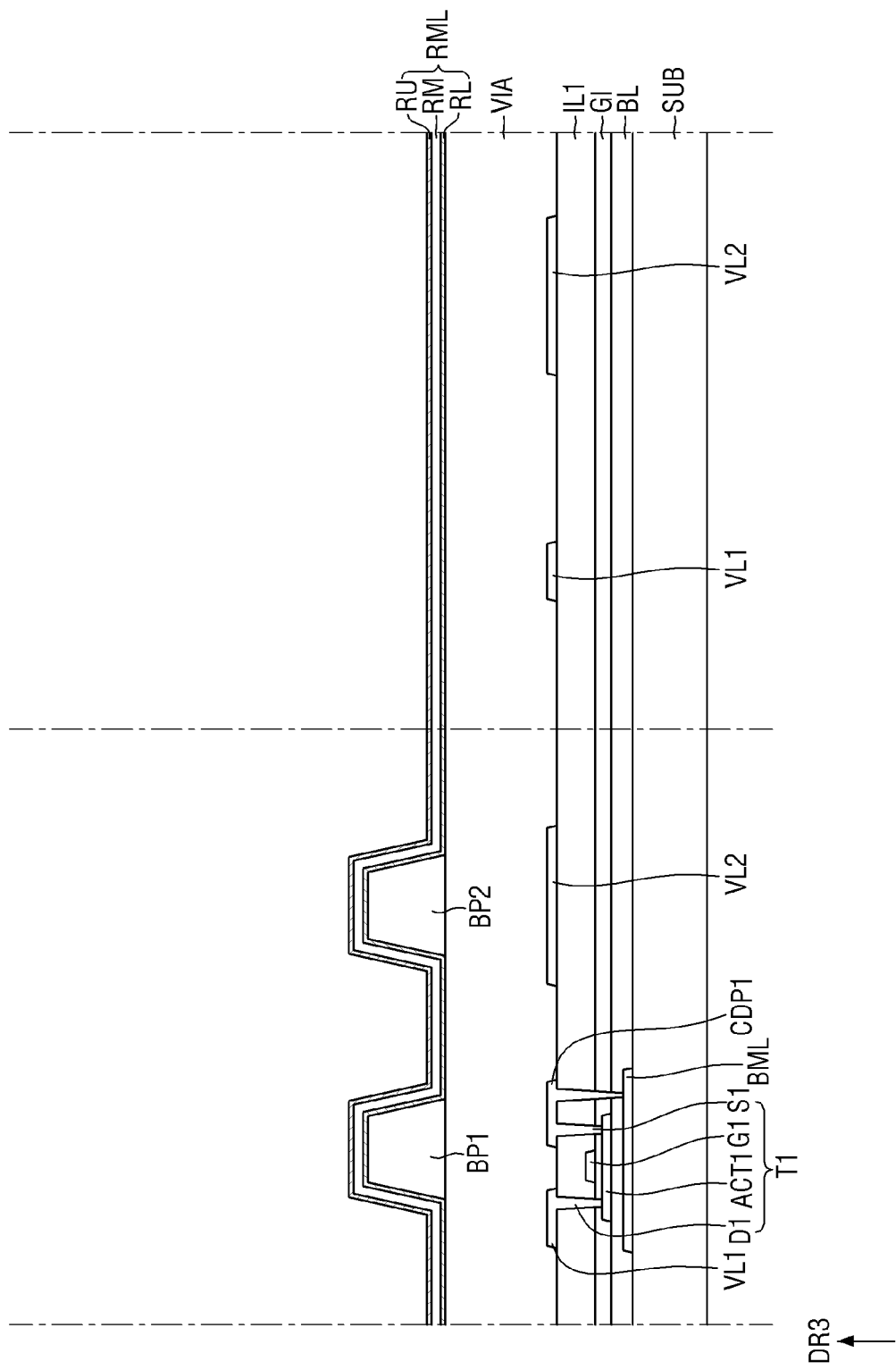

Thereafter, referring to FIG. 10, bank patterns (BP1 and BP2) are formed on the via layer VIA, in a display area DPA, and an electrode metal layer RML, is formed in the entire display area DPA. The electrode metal layer RML may be disposed directly on the via layer VIA and may cover (or overlap) the bank patterns (BP1 and BP2). The electrode metal layer RML may include an electrode base layer RL, a main electrode layer RM, and an electrode upper layer RU and may be patterned later into electrodes RME. The electrode base layer RL and the electrode upper layer RU may include a conductive material not including Al, and the main electrode layer RM may include Al. The electrode metal layer RML may be formed by continuously performing processes of depositing metallic materials on the first substrate SUB.

Figure 11:
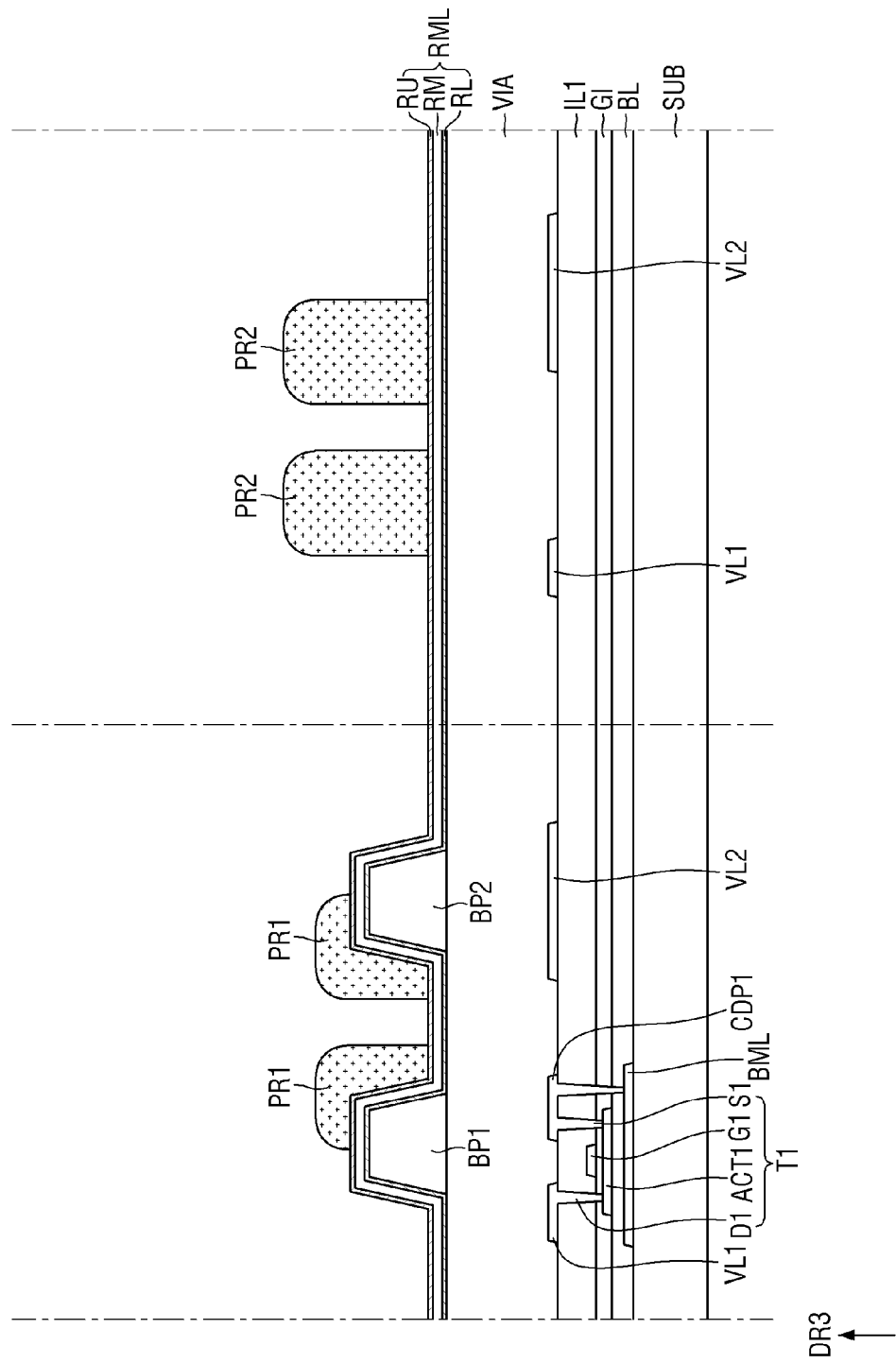
Figure 12:
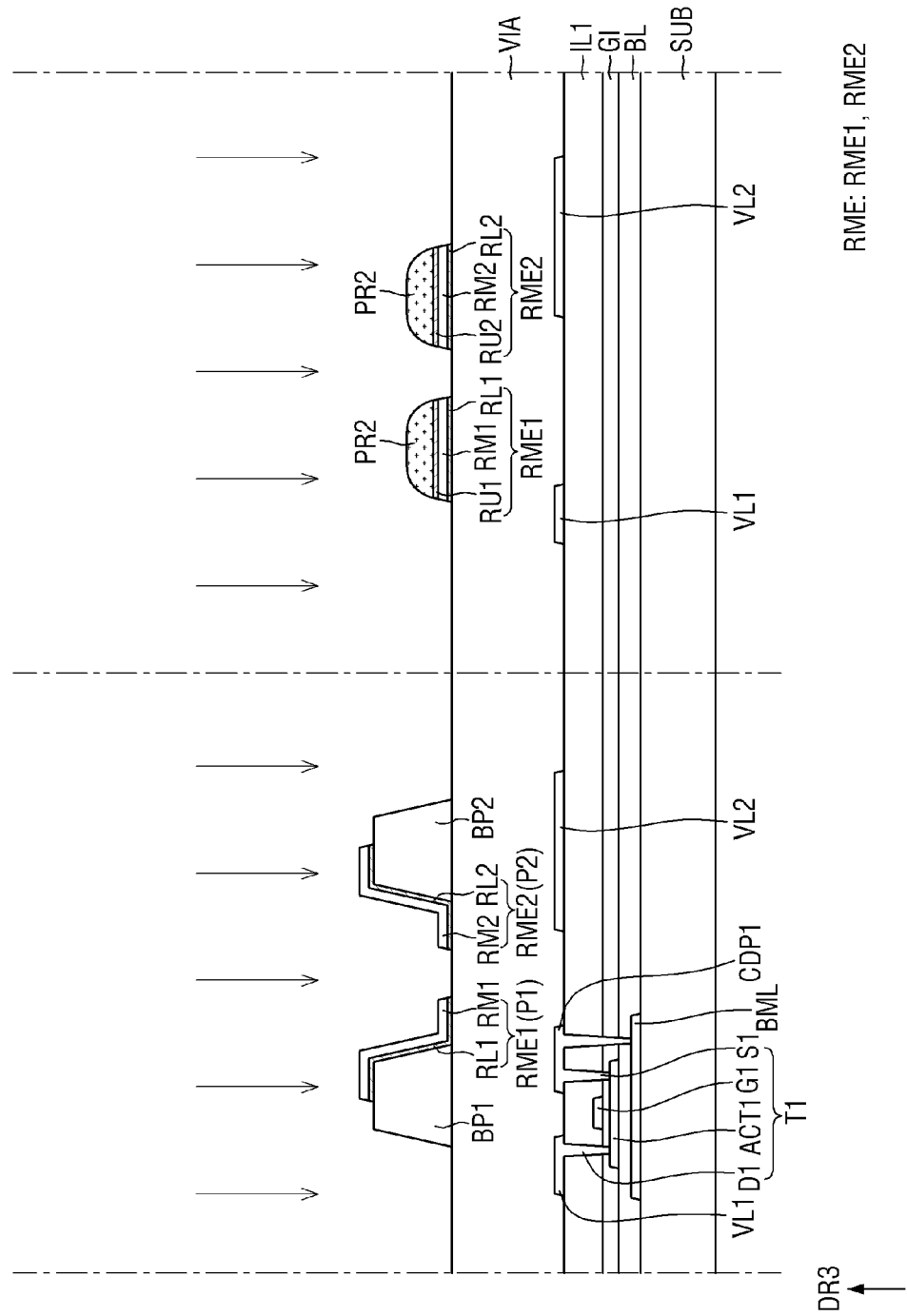
Figure 13:
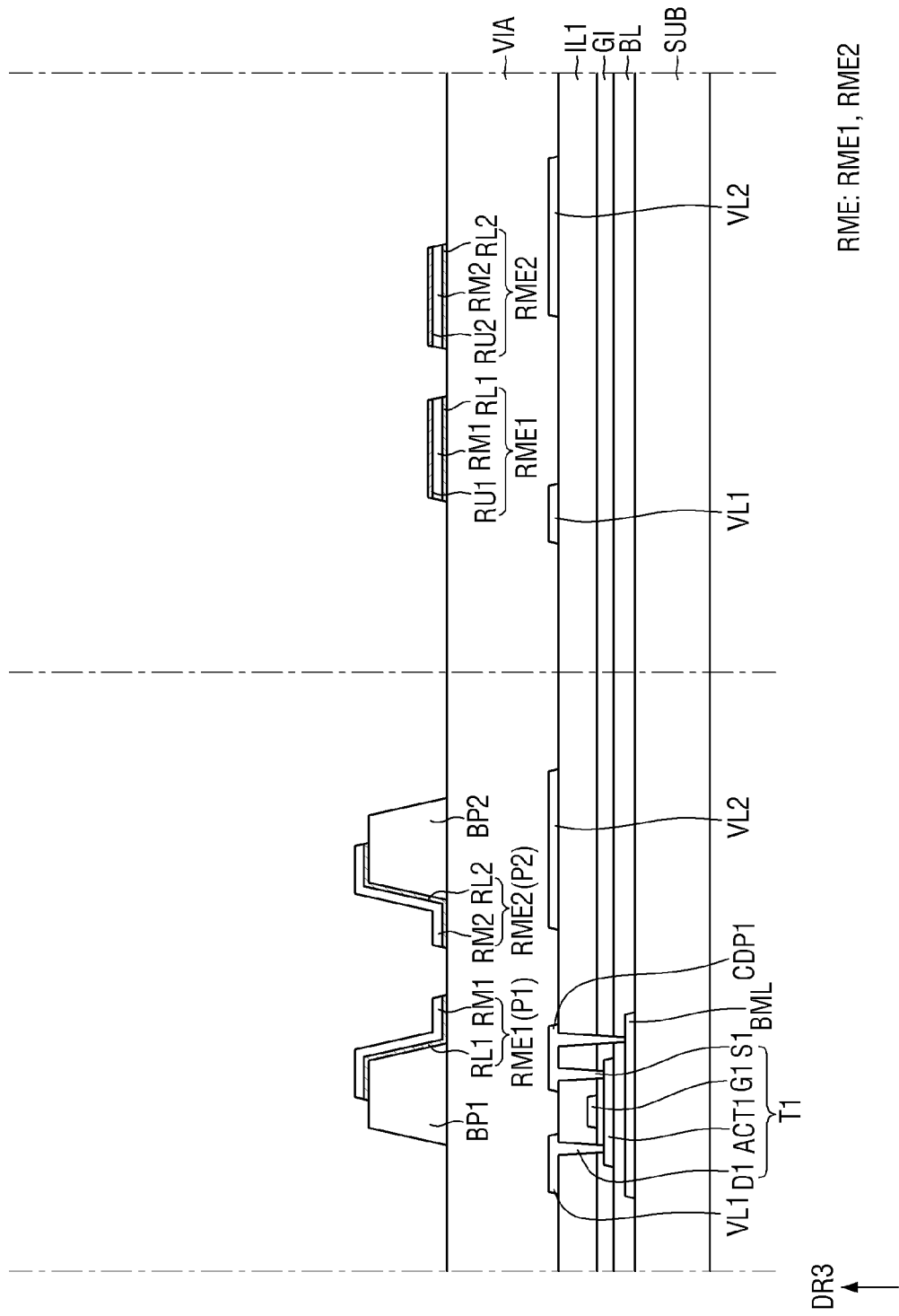

Thereafter, referring to FIGS. 11 to 13, the electrodes RME are formed by patterning the electrode metal layer RML.

Referring first to FIG. 11, photoresist patterns (e.g., PR1 and PR2) are formed on the electrode metal layer RML. The photoresist patterns (PR1 and PR2) may be formed by applying a photoresist material on the entire surface of the electrode metal layer RML and subjecting the photoresist material to exposure and development. The photoresist patterns (PR1 and PR2) may be used as a mask during a patterning process for forming the electrodes RME.

The first photoresist patterns PR1 may be disposed to cover the bank patterns (BP1 and BP2) and may thus be used as a mask for forming first and second parts (P1 and P2) of the electrodes RME where the electrode upper layer RU is not disposed, and the second photoresist patterns PR2 may be used as a mask for forming parts of the electrodes RME in a subarea SA. The electrode upper layer RU may or may not be provided depending on the location of the electrodes RME. The electrode upper layer RU may be completely removed from above the bank patterns (BP1 and BP2) and may not be removed elsewhere.

The photoresist patterns (PR1 and PR2) may have different thicknesses depending on the shape into which, and the amount by which, the electrode metal layer RML, is patterned. For example, the first photoresist patterns PR1 may be thinner than the second photoresist patterns PR2. During an etching process for removing parts where the photoresist patterns (PR1 and PR2) are not disposed, the photoresist patterns (PR1 and PR2) may also be removed partially. The rate at which the photoresist patterns (PR1 and PR2) are removed may vary depending on the thickness of the photoresist patterns (PR1 and PR2), and during the etching process, the electrode upper layer RU may also be removed from below the photoresist patterns (PR1 and PR2) in areas where the photoresist patterns (PR1 and PR2) are thin. The first photoresist patterns PR1 may be parts where the electrode upper layer RU of the electrode metal layer RML is removed, and the second photoresist patterns PR2 may be parts where all the layers of the electrode metal layer RML remain.

The photoresist patterns (PR1 and PR2) may be formed by exposure and development processes using a halftone mask or a slit mask. The thickness of the photoresist patterns (PR1 and PR2) may vary depending on the shape into which the electrode metal layer RML is patterned, particularly, the shape of the electrodes RME. For example, the parts P1 and P2 where first and second main electrode layers RM1 and RM2 are exposed may remain in areas where the first photoresist patterns PR1 are disposed, and first and second electrode upper layers RU1 and RU2 of the electrodes RME may remain in areas where the second photoresist patterns PR2 are disposed. As already mentioned above, light-emitting elements ED may be disposed between the bank patterns (BP1 and BP2), and the first and second main electrode layers RM1 and RM2 need to be exposed in parts of the electrodes RME on the bank patterns (BP1 and BP2). To this end, the locations of the first photoresist patterns PR1 may be controlled based on the locations of the first and second bank patterns BP1, and the second photoresist patterns PR2 may be disposed in areas where first and second contact holes CTD and CTS and first and second contacts CT1 and CT2 are to be formed.

Thereafter, referring to FIGS. 12 and 13, the electrodes RME are formed by patterning the electrode metal layer RML using the photoresist patterns (PR1 and PR2) as a mask. All the layers of the electrode metal layer RML may be patterned so that the electrode metal layer RML may be removed from areas where the photoresist patterns (PR1 and PR2) are not disposed. For example, the electrode metal layer RML may be completely removed from a region between the bank patterns (BP1 and BP2) where the photoresist patterns (PR1 and PR2) are not disposed.

The electrode metal layer RML may be patterned by dry etching or wet etching. As already mentioned above, as the main electrode layer RM, the electrode base layer RL, and the electrode upper layer RU include different materials, the main electrode layer RM, the electrode base layer RL, and the electrode upper layer RU may have different etch selectivities with respect to the same etchant. The type of etching may be selected in accordance with the material of each of the layers of the electrode metal layer RML. For example, the layers of the electrode metal layer RML may be patterned at the same time by dry etching so that sides of the patterned layers of the electrode metal layer RML may fall on the same plane(s) in a cross-sectional view. For example, sides of the patterned layers of the electrode metal layer RML may form a single-tapered shape in each area where the electrode metal layer RML is etched away. Each of the electrodes RME may have a single-tapered shape not only on sides of first and second electrode base layers RL1 and RL2 and sides of the first and second electrode upper layers RU1 and RU2, but also on sides of the first and second main electrode layers RM1 and RM2 may fall on the same plane(s) depending on etching conditions, but the disclosure is not limited thereto. As another example, each of the electrodes RME may have a double-tapered shape on the sides of each of the first and second electrode base layers RL1 and RL2, the sides of each of the first and second electrode upper layers RU1 and RU2, and the sides of each of the first and second main electrode layers RM1 and RM2.

Figure 14:
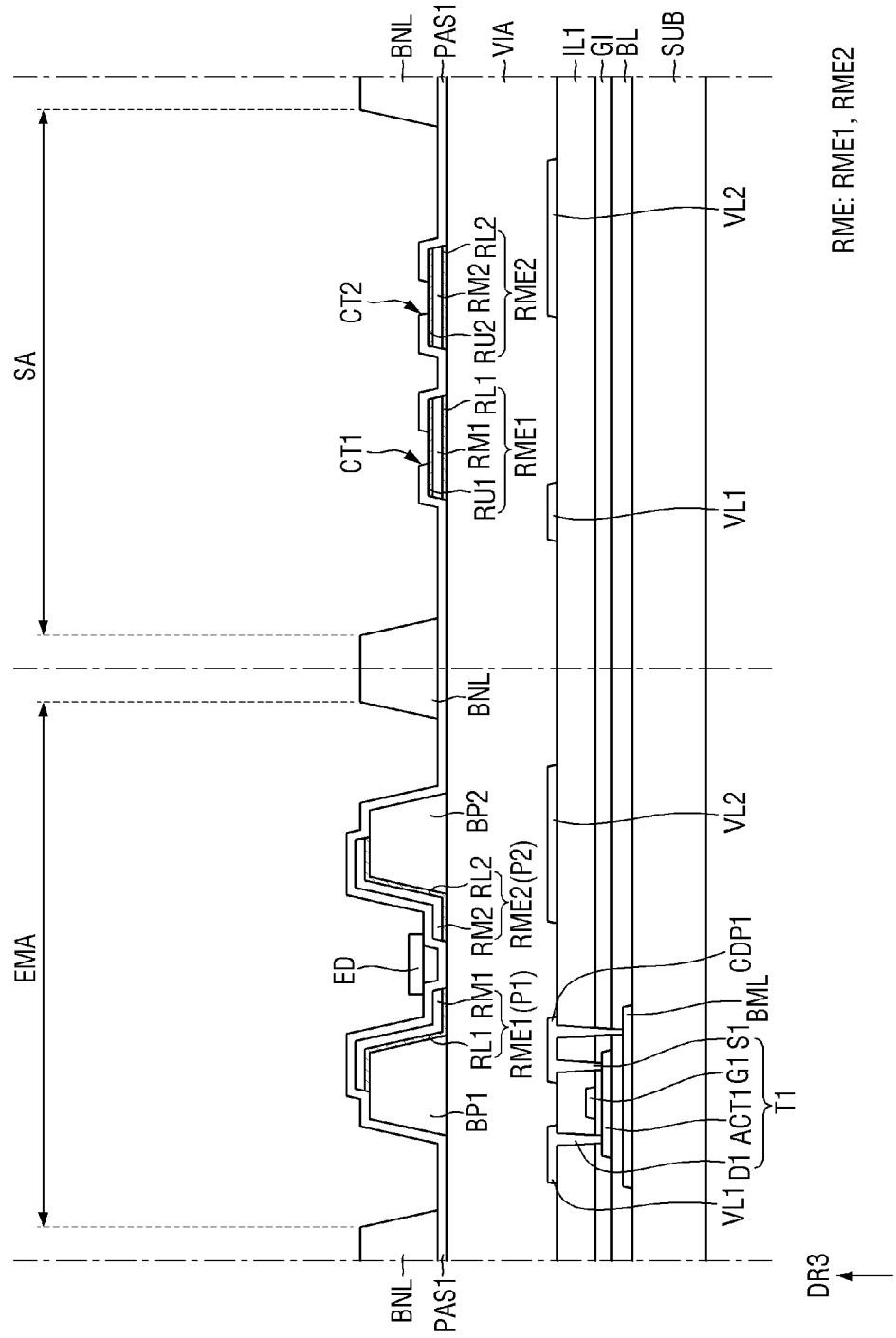

Thereafter, referring to FIG. 14, a first insulating layer PAS1, which covers (or overlap) parts of the electrodes RME, and a bank layer BNL, which is disposed on the first insulating layer PAS1, are formed, and light-emitting elements ED are disposed on the electrodes RME, e.g., on first and second electrodes RME1 and RME2.

The first insulating layer PAS1 may cover the electrodes RME, may be disposed in the entire display area DPA, and may include first and second contacts CT1 and CT2, which expose parts of the top surfaces of the electrodes RME. Parts of the electrodes RME, exposed by the first and second contacts CT1 and CT2, may be the electrode upper layers RU1 and RU2, and parts of the first and second main electrode layers RM1 and RM2 in an emission area EMA may be covered by the first insulating layer PAS1. Thus, the first and second main electrode layers RM1 and RM2 can be prevented from being damaged, even if subsequent processes are performed after the formation of the first insulating layer PAS1.

Light-emitting elements ED may be disposed on the electrode RME by inkjet printing. Ink having the light-emitting elements ED dispersed therein may be sprayed into an area surrounded by the bank layer BNL, and electric signals may be applied to the electrodes RME. Then, the light-emitting elements ED may be mounted on the electrodes RME with their location and alignment direction changing.

Figure 15:
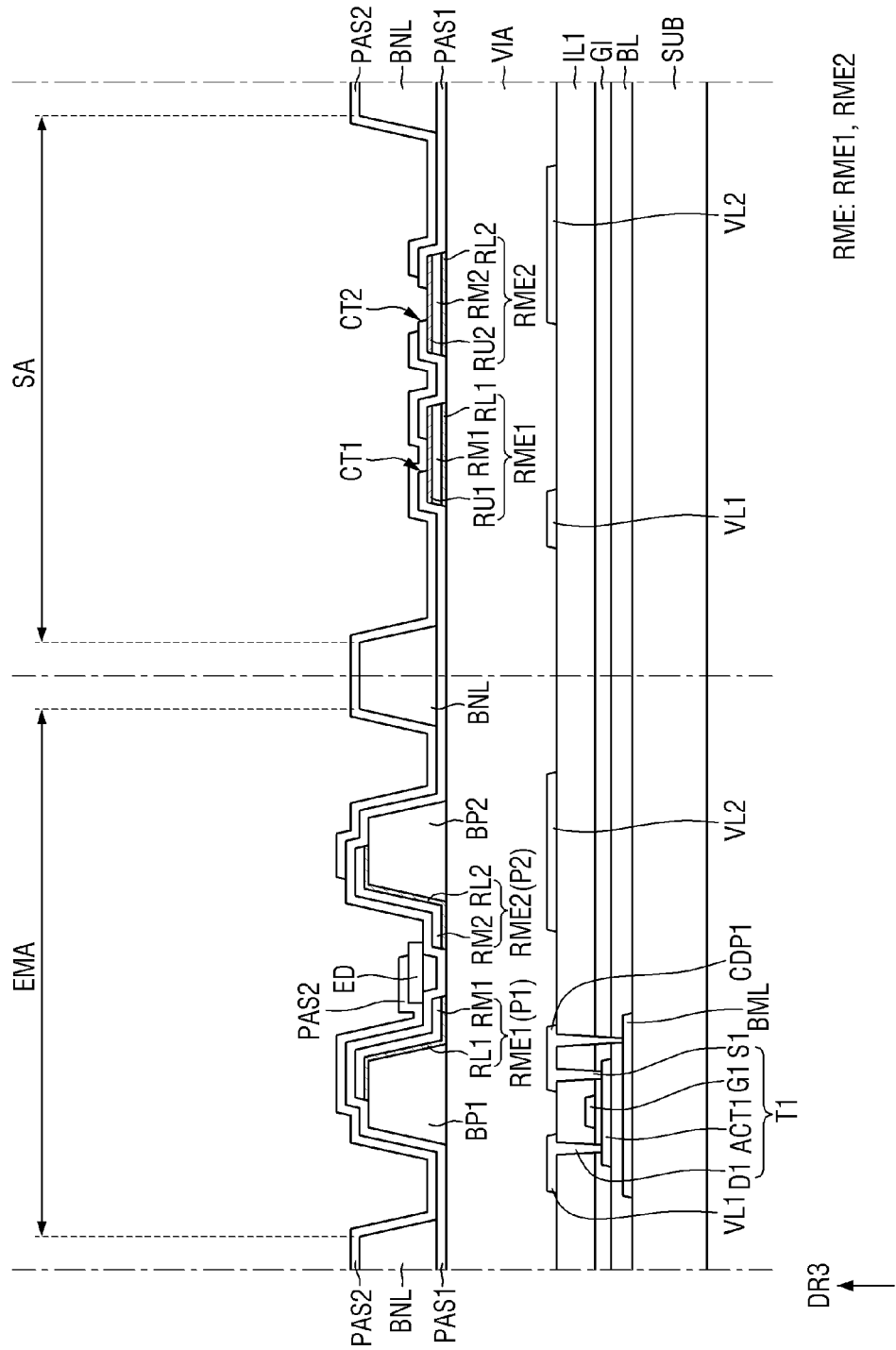

Thereafter, referring to FIG. 15, a second insulating layer PAS2 is formed on the light-emitting elements ED and the first insulating layer PAS1. The second insulating layer PAS2 may cover and fix the light-emitting elements ED. The second insulating layer PAS2 may initially be formed on the entire surface of the first insulating layer PAS1, in the display area DPA, and may be patterned later not to cover the second contact CT2 and sides of the light-emitting elements ED. An area from which the second insulating layer PAS2 is patterned away may be an area A second connecting electrode CNE2 may be disposed in an area from which the second insulating layer PAS2 is patterned away, and a first connecting electrode CNE1 may be disposed in an area from which the second insulating layer PAS2 and a third insulating layer PAS3 are both patterned away.

Figure 16:
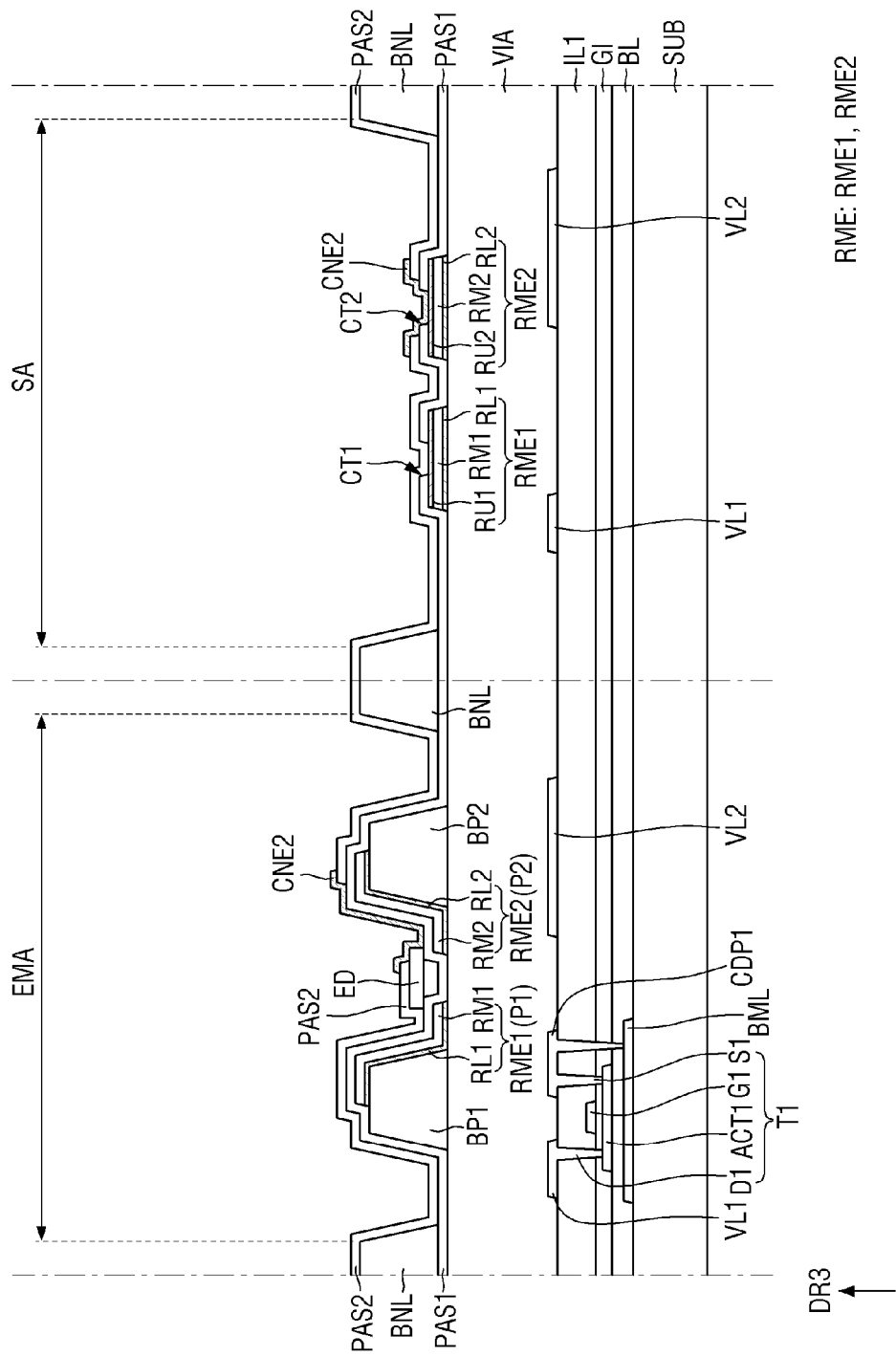

Referring to FIG. 16, the second connecting electrode CNE2 is formed in an area exposed by the second insulating layer PAS2. The second connecting electrode CNE2 may contact first end portions of the light-emitting elements ED, exposed by the second insulating layer PAS2, and the second electrode upper layer RU2 exposed by the second contact CT2.

Figure 17:
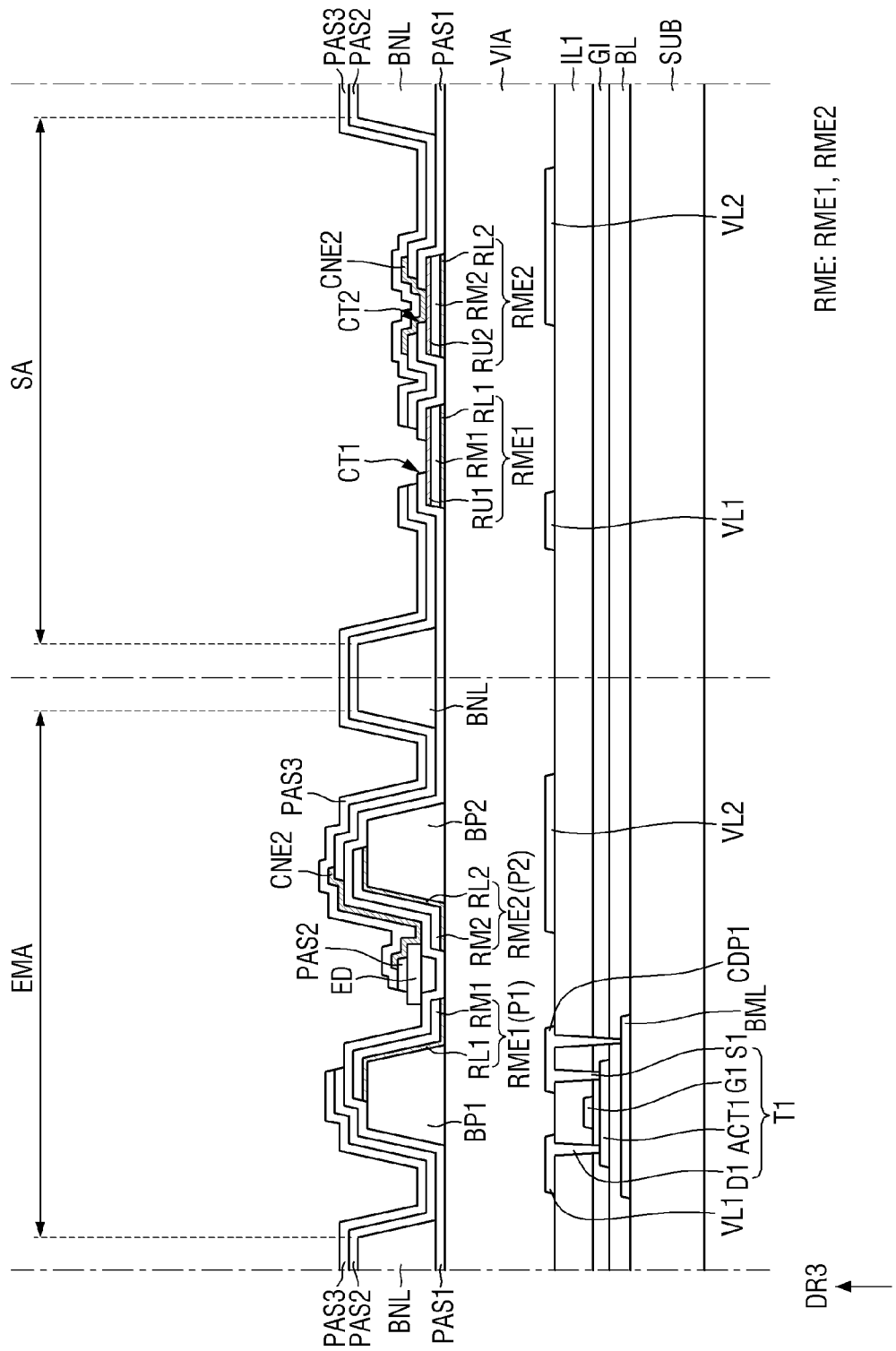

Referring to FIG. 17, the third insulating layer PAS3 is formed on the second insulating layer PAS2 and the second connecting electrode CNE2 and may expose the first contact CT1 and second end portions of the light-emitting elements ED. The third insulating layer PAS3 may initially be formed on the entire top surface of the second insulating layer PAS2 and the entire top surface of the second connecting electrode CNE2, and may be patterned later to expose the first contact CT1 and the second end portions of the light-emitting elements ED. Although not specifically illustrated, the first connecting electrode CNE1 may be formed in the display area DPA, thereby obtaining the display device 10.

Display devices according to other embodiments will hereinafter be described.

Figure 18:
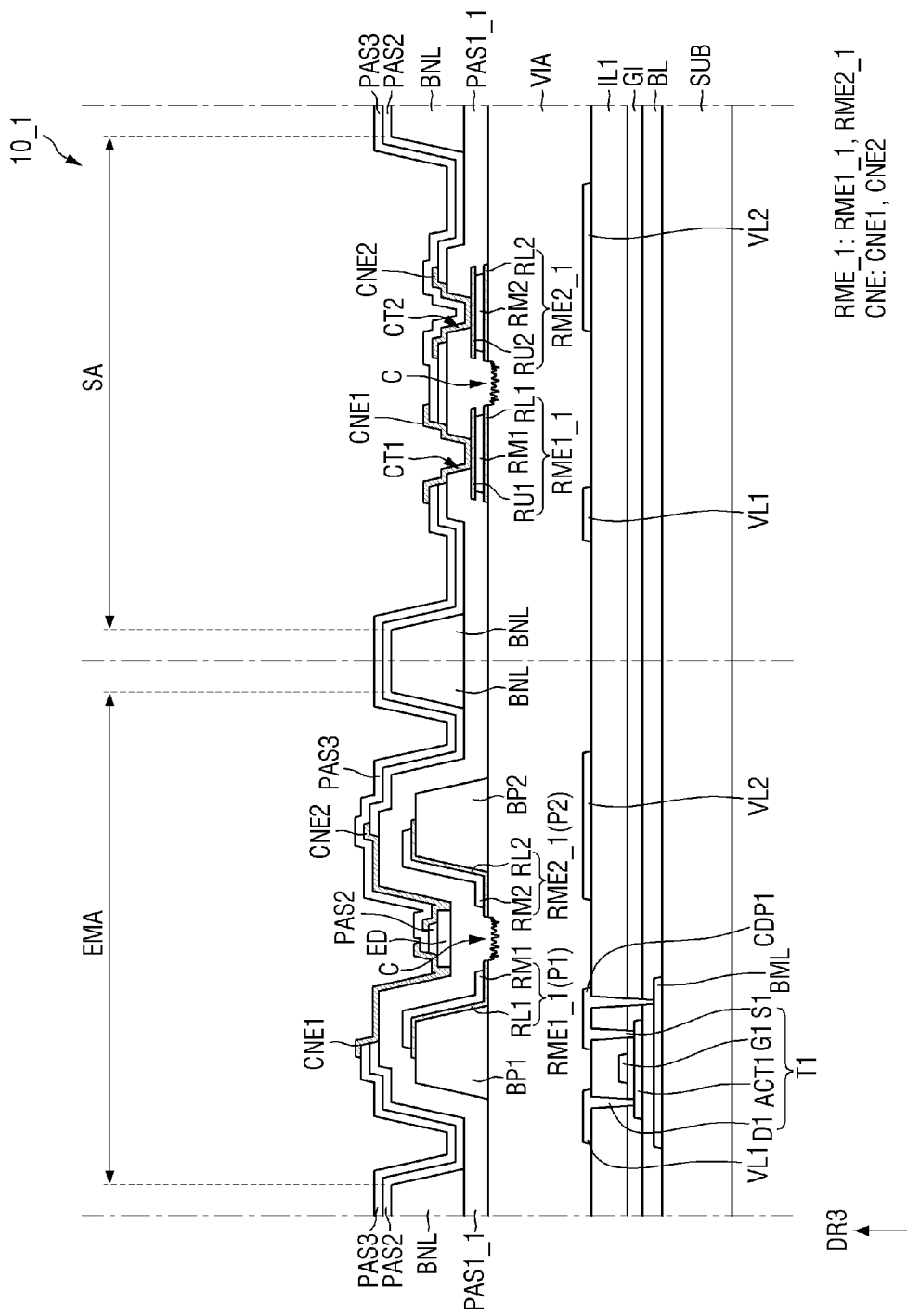
FIGS. 18 and 19 are schematic cross-sectional views of parts of a display device according to another embodiment of the disclosure.
Figure 19:
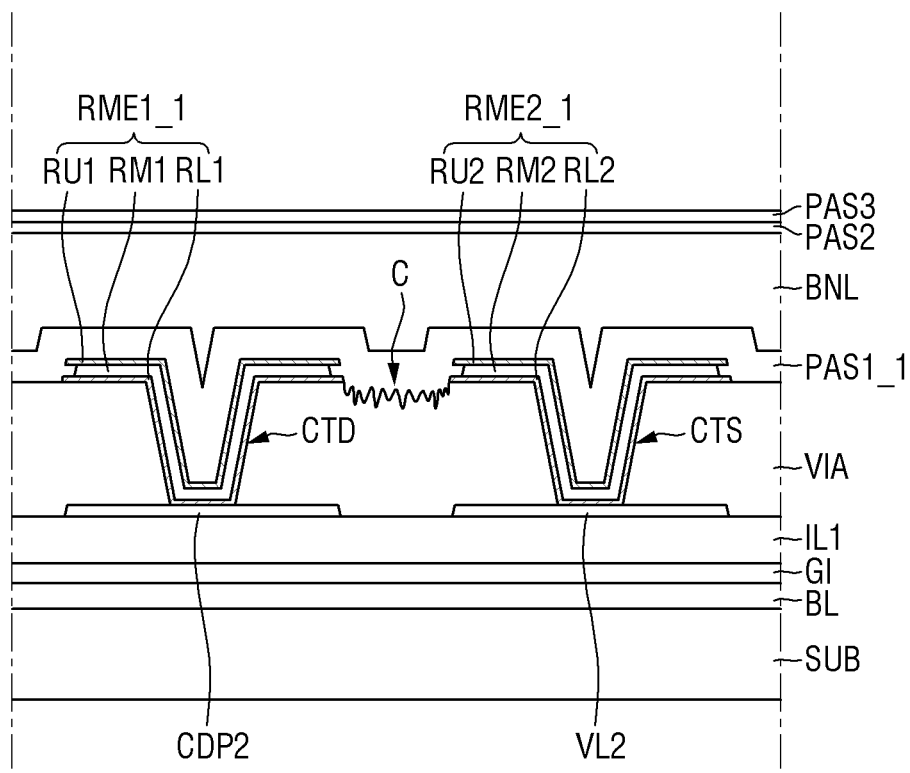

FIGS. 18 and 19 are schematic cross-sectional views of parts of a display device according to embodiments. FIG. 18 illustrates an emission area EMA and a subarea SA of a display device 10_1, and FIG. 19 illustrates first and second contact holes CTD and CTS through which first and second electrodes RME1_1 and RME2_1 are electrically connected to a third conductive layer. Structures illustrated in FIGS. 18 and 19 may correspond to the structures illustrated in FIGS. 4 and 5.

Referring to FIGS. 18 and 19, in the display device 10_1, first and second electrode base layers RL1 and RL2, first and second electrode upper layers RU1 and RU2, and first and second main electrode layers RM1 and RM2 may be removed at a different etching rate during the patterning of an electrode metal layer RML, and as a result, each of the first and second electrodes RME1_1 and RME2_1 may have a double-tapered shape on sides thereof. Both sides of each of the first and second main electrode layers RM1 and RM2 may be inwardly recessed from both sides of each of the first and second electrode base layers RL1 and RL2 and both sides of each of the first and second electrode upper layers RU1 and RU2.

During the patterning of the electrode metal layer RML using photoresist patterns (PR1 and PR2) as a mask, a main electrode layer RM, an electrode base layer RL, and an electrode upper layer RU of the electrode metal layer RML may be etched at different rates depending on their materials and the type of etchant used. For example, as the main electrode layer RM includes a different material from the electrode base layer RL and the electrode upper layer RU, the main electrode layer RM may be etched faster than the electrode base layer RL and the electrode upper layer RU. As a result, the main electrode layer RM may be more etched than the electrode base layer RL and the electrode upper layer RU, and sides of each of etched parts of the first and second main electrode layers RM1 and RM2 may be recessed more inwardly than sides of each of etched parts of the first and second electrode base layers RL1 and RL2 and sides of each of etched parts of the first and second electrode upper layers RU1 and RU2.

Accordingly, each of the first and second electrodes RME1_1 and RME2_1 of the display device 10_1 may have a double-tapered shape on both sides thereof. For example, in the emission area EMA, the first and second electrode base layers RL1 and RL2 of the first and second electrodes RME1_1 and RME2_1 may have a greater width than the first and second main electrode layers RM1 and RM2 of the first and second electrodes RME1_1 and RME2_1, and both sides of each of the first and second main electrode layers RM1 and RM2 may be recessed more inwardly than both sides of each of the first and second electrode base layers RL1 and RL2. Similarly, in the subarea SA, the first and second electrode base layers RL1 and RL2 and the first and second electrode upper layers RU1 and RU2 of the first and second electrodes RME1_1 and RME2_1 may have a greater width than the first and second main electrodes RM1 and RM2 of the first and second electrodes RME1_1 and RME2_1, and both sides of each of the first and second main electrodes RM1 and RM2 may be recessed more inwardly than both sides of each of the first and second electrode base layers RL1 and RL2 and both sides of each of the first and second electrode upper layers RU1 and RU2.

As each of the electrodes RME_1 has a double-tapered shape on both sides thereof, height differences may be formed on layers that are disposed on the electrodes RME_1. Specifically, a first insulating layer PAS1_1 may be disposed on the electrodes RME_1 and may insulate the electrodes RME_1 from one another or provide space in which light-emitting elements ED can be arranged. During the removal of the electrode upper layer RU from the emission area EMA in the process of etching the electrode metal layer RML, the top surface of a via layer VIA may be partially etched so that a crack C may be formed.

The first insulating layer PAS1_1 may include an organic insulating material and may thus have a relatively flat top surface regardless of the presence of the electrodes RME_1 and the crack C in the via layer VIA. The first insulating layer PAS1_1 may include an organic insulating material and may thus be thicker than the first insulating layer PAS1 of FIG. 4, which includes an inorganic insulating material. The first insulating layer PAS1_1 may cover the crack C, which is formed in the via layer VIA, and may thus compensate for height differences formed by the crack C. Even if each of the electrodes RME_1 has a double-tapered shape on both sides thereof, height differences formed by the first and second main electrode layers RM1 and RM2, which are inwardly recessed below the first and second electrode upper layers RU1 and RU2, can be compensated for.

If the etching rate of the electrode base layer RL and the electrode upper layer RU is faster than the etching rate of the main electrode layer RM, each of the electrodes RME_1 may have a reversed tapered shape on both sides thereof. The etching rate of the electrode metal layer RML may vary depending on the type of etching, and as a result, the tapered shape of the electrodes RME_1 may vary.

Figure 20:
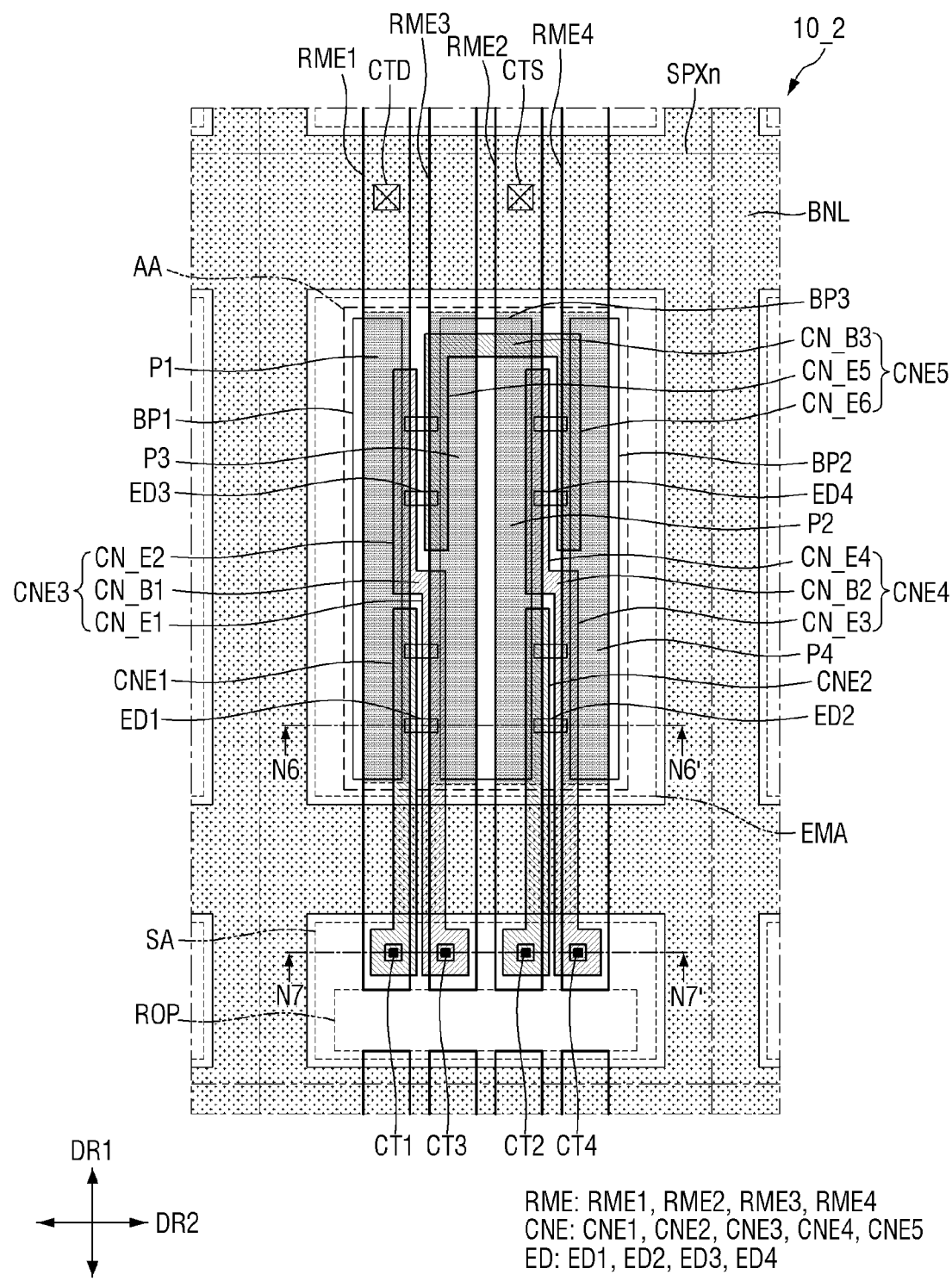
FIG. 20 is a schematic plan view of a subpixel of a display device according to another embodiment of the disclosure.
Figure 21:
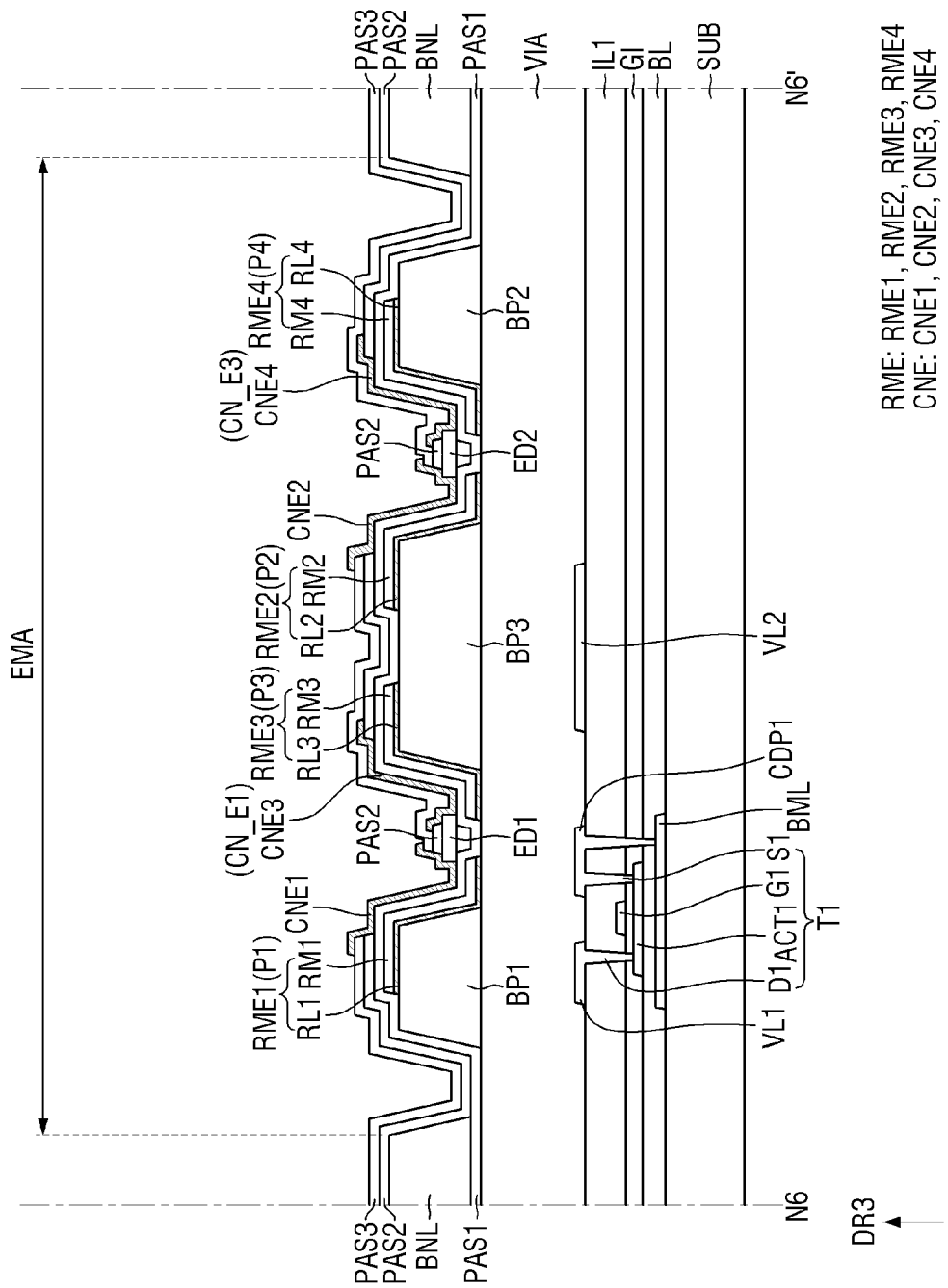
FIG. 21 is a schematic cross-sectional view taken along line N6-N6' of FIG. 20.
Figure 22:
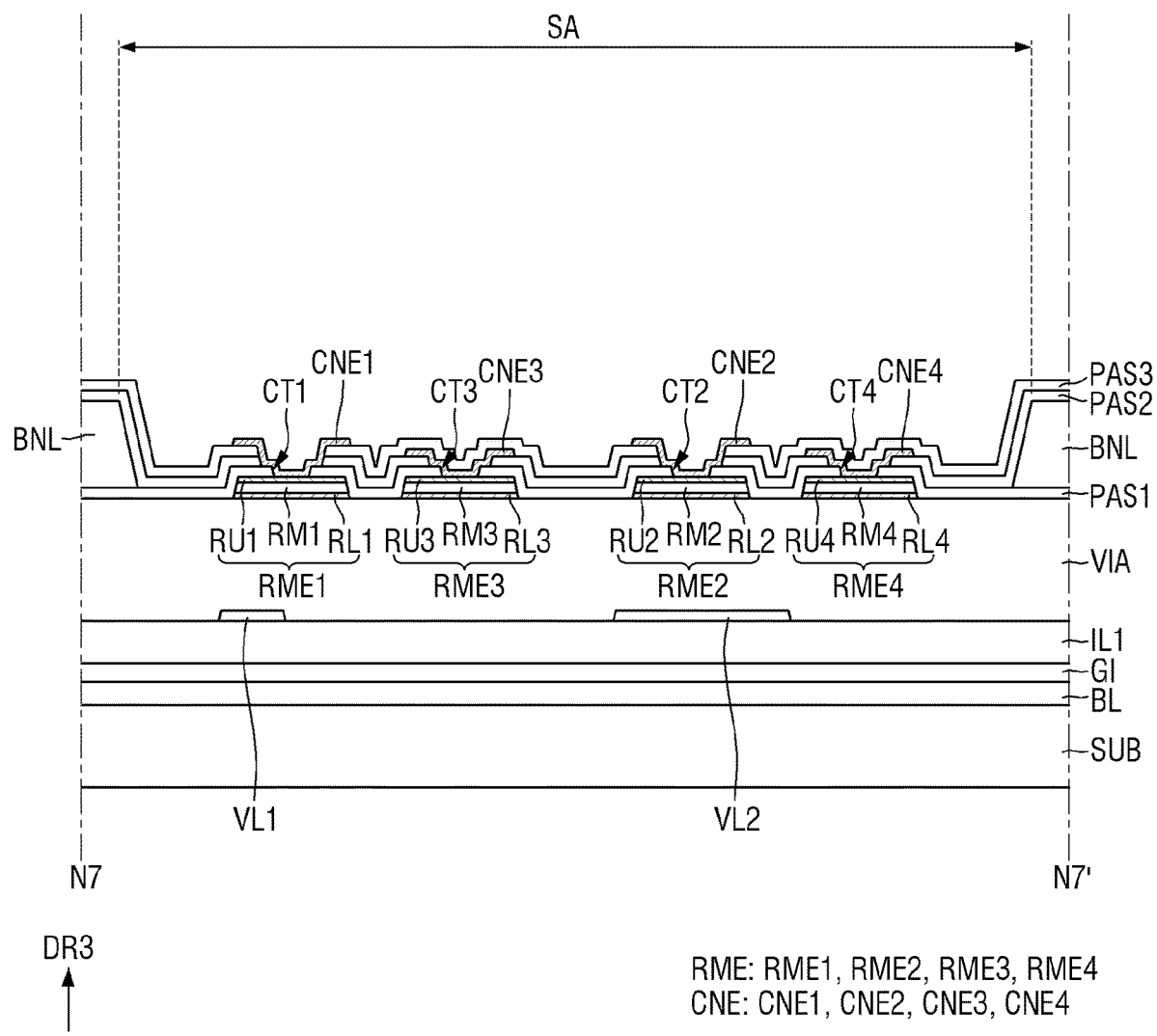
FIG. 22 is a schematic cross-sectional view taken along line N7-N7' of FIG. 20.

FIG. 20 is a schematic plan view of a subpixel of a display device according to another embodiment of the disclosure. FIG. 21 is a schematic cross-sectional view taken along line N6-N6' of FIG. 20. FIG. 22 is a schematic cross-sectional view taken along line N7-N7' of FIG. 20. FIG. 21 illustrates a schematic cross-sectional view taken across both end portions of each of first and second light-emitting elements ED1 and ED2 of FIG. 20, and FIG. 22 illustrates a schematic cross-sectional view taken across first, second, third, and fourth contacts CT1, CT2, CT3, and CT4 of FIG. 20.

Referring to FIGS. 20 to 22, a display device 10_2 may include a relatively large number of electrodes RME and a relatively large number of connecting electrodes CNE, and the number of light-emitting elements ED disposed in each subpixel SPXn may be increased. The display device 10_2 differs from the display device 10 of FIGS. 4 to 6 in the presence of bank patterns (e.g., BP1, BP2, and BP3) and the patterns of arrangement of the electrodes RME and the connecting electrodes CNE in each subpixel SPXn. The display device 10_2 will hereinafter be described, focusing mainly on the differences with the display device 10 of FIGS. 3 to 7.

The bank patterns (BP1, BP2, and BP3) may include first and second bank patterns BP1 and BP2 and may further include a third bank pattern BP3 which is disposed between the first and second bank patterns BP1 and BP2. The first bank pattern BP1 may be disposed on the left side of the center of an emission area EMA of a subpixel SPXn, the second bank pattern BP2 may be disposed on the right side of the center of the emission area EMA, and the third bank pattern BP3 may be disposed in the middle or center of the emission area EMA. The width, in a second direction DR2, of the third bank pattern BP3 may be greater than the widths, in the second direction DR2, of the bank patterns (BP1 and BP2). The distance, in the second direction DR2, between the bank patterns (BP1, BP2, and BP3) may be greater than the distance between electrodes RME. Accordingly, the electrodes RME may be disposed not to overlap at least in part with the bank patterns (BP1, BP2, and BP3).

The electrodes RME may include first and second electrodes RME1 and RME2 and may further include third and fourth electrodes RME3 and RME4.

The third electrode RME3 may be disposed between the first and second electrodes RME1 and RME2, and the fourth electrode RME4 may be spaced apart from the third electrode RME3 in the second direction DR2 with the second electrode RME2 interposed therebetween. The electrodes RME may be arranged in the order of the first, third, second, and fourth electrodes RME1, RME3, RME2, and RME4 in a left-to-right direction.

The first, second, third, and fourth electrodes RME1, RME2, RME3, and RME4 may include first, second, third, and fourth electrode base layers RL1, RL2, RL3, and RL4, respectively, first, second, third, and fourth main electrode layers RM1, RM2, RM3, and RM4, respectively, and first, second, third, and fourth electrode upper layers RU1, RU2, RU3, and RU4, respectively. As already mentioned above with reference to FIGS. 3 to 7, the first, second, third, and fourth main electrode layers RM1, RM2, RM3, and RM4 may be disposed on the entire surfaces of the first, second, third, and fourth electrode base layers RL1, RL2, RL3, and RL4, respectively, but the first, second, third, and fourth electrode upper layers RU1, RU2, RU3, and RU4 may be disposed only on parts of the first, second, third, and fourth main electrode layers RM1, RM2, RM3, and RM4, respectively. The first and second electrodes RME1 and RME2 may include the first and second parts P1 and P2. Similarly, the third electrode RME3 may include a third part P3 where the third electrode upper layer RU3 is not disposed so that the top surface of the third main electrode layer RM3 is partially exposed, and the fourth electrode RME4 may include a fourth part P4 where the fourth electrode upper layer RU4 is not disposed so that the top surface of the fourth main electrode layer RM4 is partially exposed. The first, second, third, and fourth parts P1, P2, P3, and P4 may be disposed in an alignment area AA of the emission area EMA.

The electrodes RME may extend from the emission area EMA to a subarea SA across a bank layer BNL. The first and second electrodes RME1 and RME2 may be electrically connected to a third conductive layer therebelow through first and second contact holes CTD and CTS. The third and fourth electrodes RME3 and RME4 may not be directly electrically connected to the third conductive layer and may be electrically connected to the first and second electrodes RME1 and RME2 through light-emitting elements ED and connecting electrodes CNE. The first and second electrodes RME1 and RME2 may be first-type electrodes directly electrically connected to the third conductive layer through the first and second contact holes CTD and CTS, and the third and fourth electrodes RME3 and RME4 may be second-type electrodes not electrically connected directly to the third conductive layer. The second-type electrodes may provide electrical connections for the light-emitting elements ED together with the connecting electrodes CNE.

Light-emitting elements ED may be disposed between the bank patterns (BP1, BP2, and BP3) or between different electrodes RME. Some of the light-emitting elements ED may be disposed between the first and third bank patterns BP1 and BP3, and the other light-emitting elements ED may be disposed between the second and third bank patterns BP2 and BP3. For example, the light-emitting elements ED may include first light-emitting elements ED1 and third light-emitting elements ED3 which are disposed between the first and third bank patterns BP1 and BP3, and second light-emitting elements ED2 and fourth light-emitting elements ED4 which are disposed between the second and third bank patterns BP2 and BP3. The first light-emitting elements ED1 and the third light-emitting elements ED3 may be disposed on the first part P1 of the first electrode RME1 and the third part P3 of the third electrode RME3, respectively, and the second light-emitting elements ED2 and the fourth light-emitting elements ED4 may be disposed on the second part P2 of the second electrode RME2 and the fourth part P4 of the fourth electrode RME4, respectively. The first light-emitting elements ED1 and the second light-emitting elements ED2 may be disposed in a lower part of the emission area EMA, adjacent to the subarea SA, and the third light-emitting elements ED3 and the fourth light-emitting elements ED4 may be disposed in an upper part of the emission area EMA. However, the light-emitting elements ED may be classified not by their locations, but by their relations to the connecting electrodes CNE. The light-emitting elements ED may be electrically connected to different sets of connecting electrodes CNE depending on the pattern of arrangement of the connecting electrodes CNE and may be classified into different types of light-emitting elements ED according to which of the connecting electrodes CNE they contact.

The layout of a first insulating layer PAS1 may be the same as the layout of the first insulating layer PAS1 of FIGS. 3 to 7. The first insulating layer PAS1 may be disposed on the entire surface of the subpixel SPX1 and may include first, second, third, and fourth contacts CT1, CT2, CT3, and CT4.

As a relatively large number of electrodes RME are disposed in the subpixel SPXn, a relatively large number of contacts (e.g., CT1, CT2, CT3, and CT4) may be provided in the subpixel SPXn. In the subarea SA, first and second contacts CT1 and CT2, which are disposed on the first and second electrodes RME1 and RME2, respectively, may be disposed, and third and fourth contacts CT3 and CT4, which are disposed on the third and fourth electrodes RME3 and RME4, respectively, may be further disposed. The first, second, third, and fourth contacts CT1, CT2, CT3, and CT4 may penetrate the first insulating layer PAS1 to expose parts of the top surfaces of the first, second, third, and fourth electrode upper layers RU1, RU2, RU3, and RU4.

The connecting electrodes CNE may include the first and second connecting electrodes CNE1 and CNE2, which are disposed on the first and second electrodes RME1 and RME2, and the third, fourth, and fifth connecting electrodes CNE3, CNE4, and CNE5, which are each disposed on multiple electrodes RME.

In the embodiment of FIGS. 20 to 22, unlike in the embodiment of FIGS. 3 to 7, the first and second connecting electrodes CNE1 and CNE2 may have a relatively small length in a first direction DR1. The first and second connecting electrodes CNE1 and CNE2 may be disposed on the lower side of the center of the emission area EMA. The first and second connecting electrodes CNE1 and CNE2 may be disposed across the emission area EMA and the subarea SA and may contact the first electrode upper layer RU1 of the first electrode RME1 and the second electrode upper layer RU2 of the second electrode RME2, respectively, through the first and second contacts CT1 and CT2, respectively, which are formed in the subarea SA.

The third connecting electrode CNE3 may include a first extension CN_E1 which is disposed on the third electrode RME3, a second extension CN_E2 which is disposed on the first electrode RME1, and a first connector CN_B1, which connects the first and second extensions CN_E1 and CN_E2. The first extension CN_E1 may be spaced apart from, and face, the first connecting electrode CNE1 in the second direction DR2, and the second extension CN_E2 may be spaced apart from the first connecting electrode CNE1 in the second direction DR2. The first extension CN_E1 may be disposed in a lower part of the emission area EMA, and the second extension CN_E2 may be disposed in the upper part of the emission area EMA. The first extension CN_E1 may be disposed across the emission area EMA and the subarea SA and may be electrically connected to the third electrode upper layer RU3 of the third electrode RME3 through the third contact CT3, which is formed in the subarea SA. The first connector CN_B1 may be disposed in the middle of the emission area EMA, over the first and third electrodes RME1 and RME3. The third connecting electrode CNE3 may generally extend in the first direction DR1, be bent in the second direction DR2, and extend back in the first direction DR1.

The fourth connecting electrode CNE4 may include a third extension CN_E3 which is disposed on the fourth electrode RME4, a fourth extension CN_E4 which is disposed on the second electrode RME2, and a second connector CN_B2, which connects the third and fourth extensions CN_E3 and CN_E4. The third extension CN_E3 may be spaced apart from, and face, the second connecting electrode CNE2 in the second direction DR2, and the fourth extension CN_E4 may be spaced apart from the second connecting electrode CNE2 in the first direction DR1. The third extension CN_E3 may be disposed in the lower part of the emission area EMA, and the fourth extension CN_E4 may be disposed in the upper part of the emission area EMA. The third extension CN_E3 may be disposed across the emission area EMA and the subarea SA and may be electrically connected to the fourth electrode upper layer RU4 of the fourth electrode RME4 through the fourth contact CT4, which is formed in the subarea SA. The second connector CN_B2 may be disposed in the middle of the emission area EMA, over the second and fourth electrodes RME2 and RME4. The fourth connecting electrode CNE4 may generally extend in the first direction DR1, be bent in the second direction DR2, and extend back in the first direction DR1.

The fifth connecting electrode CNE5 may include a fifth extension CN_E5 which is disposed on the third electrode RME3, a sixth extension CN_E6 which is disposed on the fourth electrode RME4, and a third connector CN_B3 which connects the fifth and sixth extensions CN_E5 and CN_E6. The fifth extension CN_E5 may be spaced apart from, and face, the second extension CN_E2 of the third connecting electrode CNE3 in the second direction DR2, and the sixth extension CN_E6 may be spaced apart from the fourth extension CN_E4 of the fourth connecting electrode CNE4 in the second direction DR2. The fifth and sixth extensions CN_E5 and CN_E6 may be disposed in the upper part of the emission area EMA, and the third connector CN_B3 may be disposed over the second, third, and fourth electrodes RME2, RME3, and RME4. The fifth connecting electrode CNE5 may be disposed to surround the fourth extension CN_E4 of the fourth connecting electrode CNE4 in a plan view.

The first and second connecting electrodes CNE1 and CNE2 may be first-type connecting electrodes contacting the first and second electrodes RME1 and RME2, which are directly connected to the third conductive layer, the third and fourth connecting electrodes CNE3 and CNE4 may be second-type connecting electrodes contacting the third and fourth electrodes RME3 and RME4, which are not directly electrically connected to the third conductive layer, and the fifth connecting electrode CNE5 may be a third-type connecting electrode contacting none of the electrodes RME.

As already mentioned above, the light-emitting elements ED may be classified into different types of light-emitting elements depending on which of the connecting electrodes CNE they are electrically connected to.

The first end portions of the first light-emitting elements ED1 and the first end portions of the second light-emitting elements ED2 may contact the first-type connecting electrodes, and the second end portions of the first light-emitting elements ED1 and the second end portions of the second light-emitting elements ED2 may contact the second-type connecting electrodes. The first light-emitting elements ED1 may contact the first and third connecting electrodes CNE1 and CNE3, and the second light-emitting elements ED2 may contact the second and fourth connecting electrodes CNE2 and CNE4. The first end portions of the third light-emitting elements ED3 and the first end portions of the fourth light-emitting elements ED4 may contact the second-type connecting electrodes, and the second end portions of the third light-emitting elements ED3 and the second end portions of the fourth light-emitting elements ED4 may contact the third-type connecting electrode. The third light-emitting elements ED3 may contact the third and fifth connecting electrodes CNE3 and CNE5, and the fourth light-emitting elements ED4 may contact the fourth and fifth connecting electrodes CNE4 and CNE5.

The light-emitting elements ED may be electrically connected in series by the connecting electrodes CNE. As the display device 10 includes a considerable number of light-emitting elements ED in the subpixel SPXn and can form serial connections between the light-emitting elements ED, the amount of light emitted per unit area can be further increased.

Figure 23:
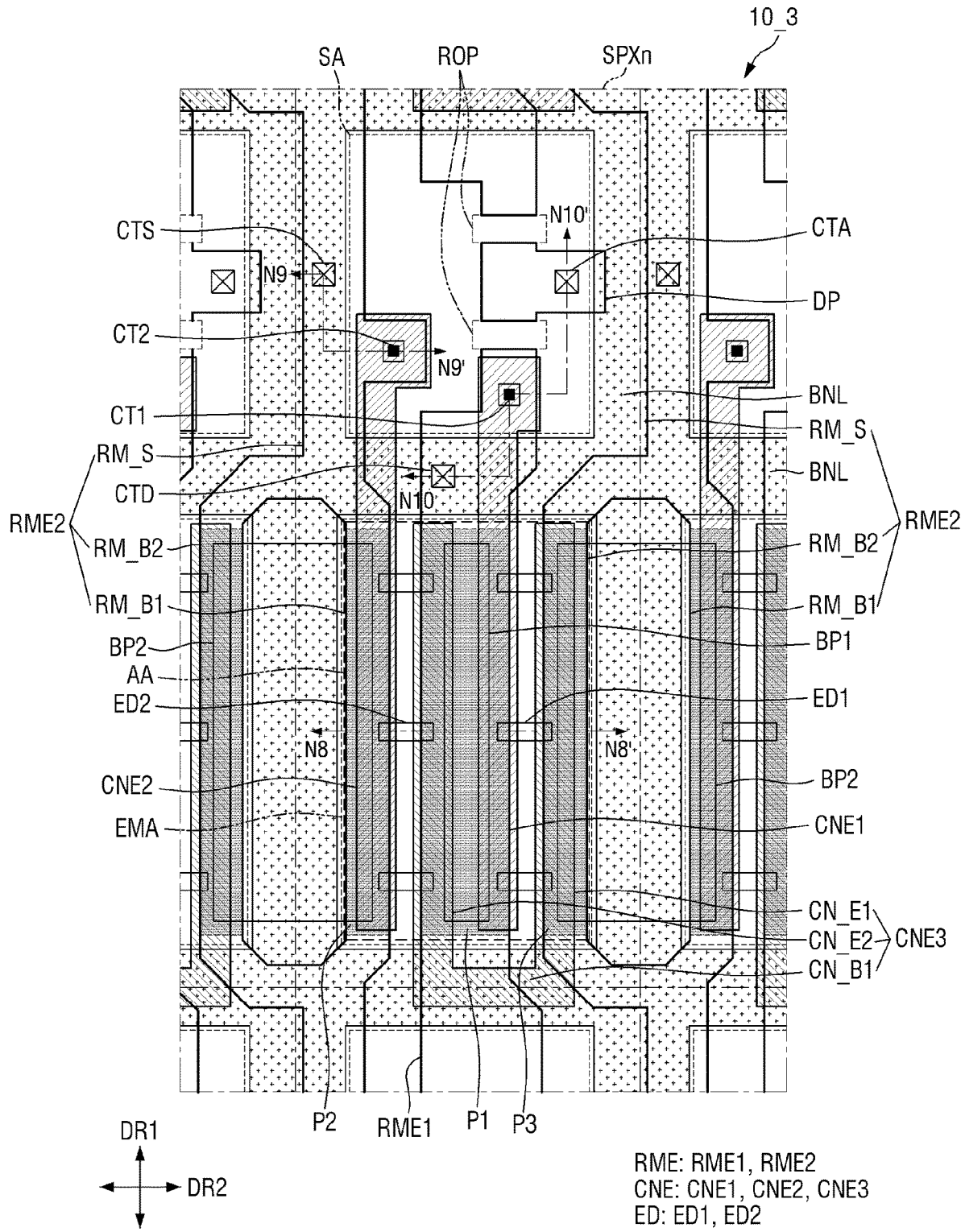
FIG. 23 is a schematic plan view of a subpixel of a display device according to another embodiment of the disclosure.
Figure 24:
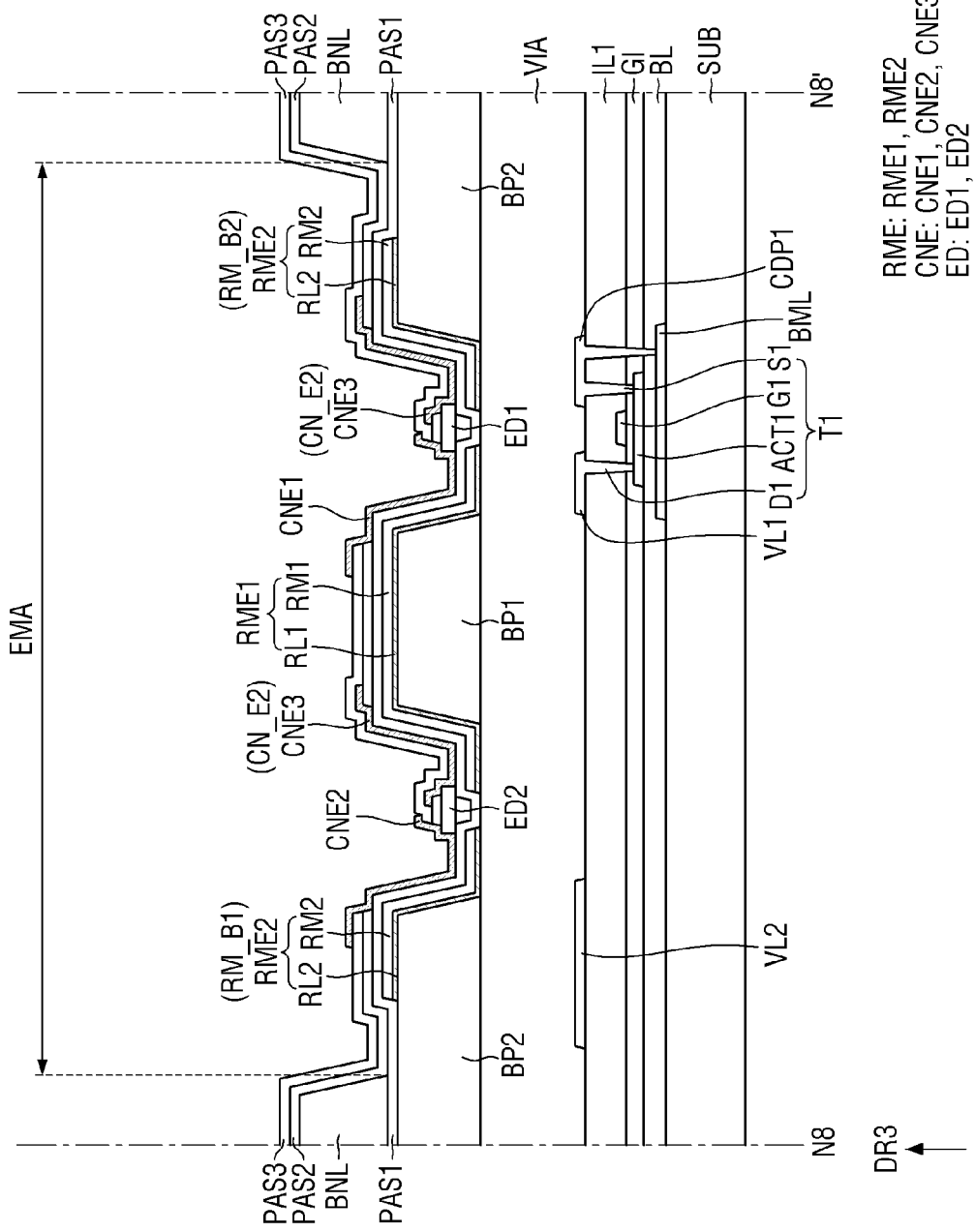
FIG. 24 is a schematic cross-sectional view taken along line N8-N8' of FIG. 23.
Figure 25:
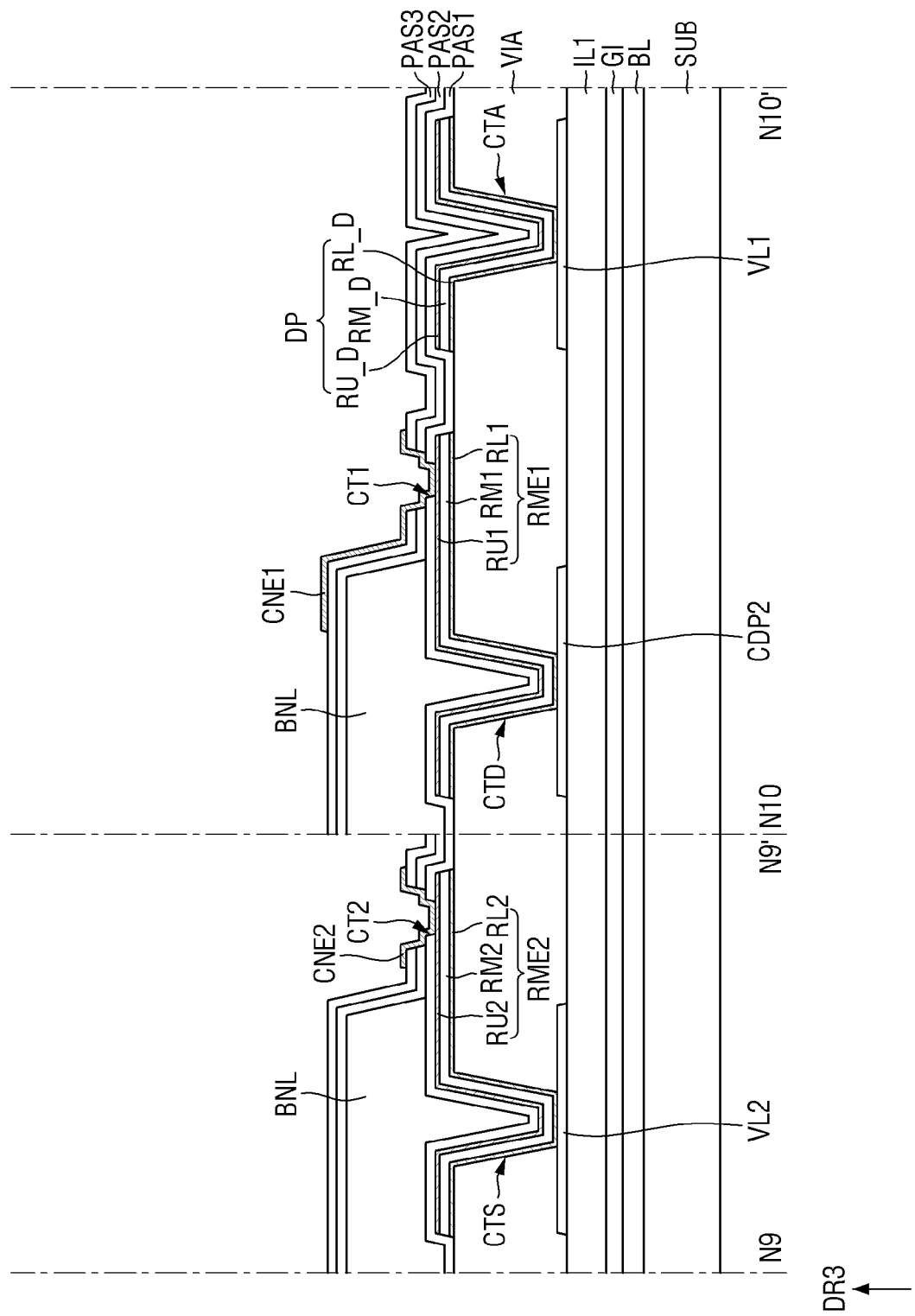
FIG. 25 is a schematic cross-sectional view taken along lines N9-N9' and N10-N10' of FIG. 23.

FIG. 23 is a plan view of a subpixel of a display device according to an embodiment. FIG. 24 is a schematic cross-sectional view taken along line N8-N8' of FIG. 23. FIG. 25 is a schematic cross-sectional view taken along lines N9-N9' and N10-N10' of FIG. 23. FIG. 23 illustrates a first subpixel SPX1 of a display device 10_3 and areas of two subpixels SPXn adjacent to the first subpixel SPX1 in a second direction DR2. FIG. 24 illustrates a schematic cross-sectional view taken across both end portions of each of first and second light-emitting elements ED1 and ED2 of the first subpixel SPX1, and FIG. 25 illustrates a schematic cross-sectional view taken cross first, second, and third contact holes CTD, CTS, and CTA and first and second contacts CT1 and CT2 of FIG. 23.

Referring to FIGS. 23 to 25, the display device 10_3 may differ from the display devices 10, 10_1, and 10_2 in the structures of electrodes RME, connecting electrodes CNE, and bank patterns (BP1 and BP2). The display device 10_3 will hereinafter be described, focusing mainly on the differences with the display devices 10, 10_1, and 10_2.

Bank patterns (BP1 and BP2) may extend in a first direction DR1 and may have different widths in the second direction DR2, and one of the bank patterns (BP1 and BP2) may be disposed over a pair of adjacent subpixels SPXn in the second direction DR2. For example, bank patterns (BP1 and BP2) of, for example, the first subpixel SPX1, may include a first bank pattern BP1, which is disposed in an emission area EMA of the first subpixel SPX1, and second bank patterns BP2, which are disposed over emission areas EMA of two different subpixels SPXn including the first subpixel SPX1.

The first bank pattern BP1 may be disposed in the middle of the emission area EMA of the first subpixel SPX1, and the second bank patterns BP2 may be spaced from each other with the first bank pattern BP interposed therebetween. The first bank pattern BP1 and the second bank patterns BP2 may be alternately arranged in the second direction DR2. Light-emitting elements ED may be disposed in the gaps between the first bank pattern BP1 and the second bank patterns BP2.

The first bank pattern BP1 and the second bank patterns BP2 may have the same length in the first direction DR1 and different widths in the second direction DR2. Parts of a bank layer BNL that extend in the first direction DR1 may overlap the second bank patterns BP2 in a thickness direction. The bank patterns (BP1 and BP2) may be arranged on the entire surface of a display area DPA as island patterns.

The electrodes RME include a first electrode RME1, which is disposed in the middle of the first subpixel SPXn, and second electrodes RME2, which are disposed over two different subpixels SPXn including the first subpixel SPX1. The first electrode RME1 and the second electrodes RME2 may generally extend in the first direction DR1 and may have different shapes in the emission area EMA of the first subpixel SPX1.

The first electrode RME1 may be disposed at the center of the first subpixel SPXn and part of the first electrode RME1 in the emission area EMA of the first subpixel SPXn may be disposed on the first bank pattern BP1. The first electrode RME1, similar to its counterpart of FIG. 3, may extend in the first direction DR1 from a subarea SA of the first subpixel SPX1 into a subarea SA of another subpixel SPXn. The first electrode RME1 may have a shape whose width in the second direction DR2 changes from one location to another location, and at least part of the first electrode RME1 on the first bank pattern BP1, in the emission area EMA, may have a larger width than the first bank pattern BP1. The first electrode RME1 may be disposed to cover both side surfaces of the first bank pattern BP1.

The second electrodes RME2 may include parts that extend in the first direction DR1 and parts that branch off near the emission area EMA of the first subpixel SPX1. Each of the second electrodes RME2 may include an electrode stem RM_S which extends in the first direction DR1, and electrode branches (RM_B1 and RM_B2), which branch off of the electrode stem RM_S to be bent into the second direction DR2 and then to extend in the first direction DR1. The electrode stem RM_S may be disposed to overlap part of the bank layer BNL that extends in the first direction DR1 and may be arranged on one side, in the second direction DR2, of the subarea SA of the first subpixel SPX1. The electrode branches (RM_B1 and RM_B2) may branch off of part of the electrode stem RM_S on part of the bank layer BNL that extends in the first and second directions DR1 and DR2, in two directions along the second direction DR2. The electrode branches (RM_B1 and RM_B2) may be disposed to extend in the first direction DR1 across their respective emission areas EMA and may be bent to be incorporated into the electrode stem RM_S and thus to be electrically connected to each other. For example, the electrode branches (RM_B1 and RM_B2) may branch off of the electrode stem RM_S in an upper part of the first subpixel SPX1 and may be electrically connected to each other in a lower part of the first subpixel SPX1.

The second electrodes RME2 may include, in the first subpixel SPX1, a first electrode branch RM_B1 which is disposed on the left side of the first electrode RME1 and a second electrode branch RM_B2 which is disposed on the right side of the first electrode RME1. First and second electrode branches RM_B1 and RM_B2 of each of the second electrodes RME2 may be disposed in two different emission areas EMA of two different subpixels SPXn adjacent to each other in the second direction DR2, and two different electrode branches (RM_B1 and RM_B2) of two different second electrodes RME2 may be disposed in a subpixel SPXn. A first electrode branch RM_B1 of one of the second electrodes RME2 may be disposed on the left side of the first electrode RME1, and a second electrode branch RM_B2 of the other second electrode RME2 may be disposed on the right side of the first electrode RME1.

Electrode branches (RM_B1 and RM_B2) of the second electrode RME2 of the first subpixel SPX1 may be disposed on sides of the second bank patterns BP2. The first electrode branch RM_B1 of the first subpixel SPX1 may be disposed on the second bank pattern BP2 on the left side of the first bank pattern BP1, and the second electrode branch RM_B2 of the first subpixel SPX1 may be disposed on the second bank pattern BP2 on the right side of the first bank pattern BP1. The first electrode RME1 may be spaced apart from, and face, two different electrode branches (RM_B1 and RM_B2) of two different second electrodes RME2, and the distance between the first electrode RME1 and the different electrode branches (RM_B1 and RM_B2) may be smaller than the distance between the bank patterns (BP1 and BP2).

The width, in the second direction DR2, of the first electrode RME1 may be greater than the width of the electrode stem RM_S and the electrode branches (RM_B1 and RM_B2) of the first subpixel SPX1. The first electrode RME1 may cover both sides of the first bank pattern BP1. On the contrary, as the second electrodes RME2 are formed to be narrower than the first electrode RME1, the electrode branches (RM_B1 and RM_B2) of the first subpixel SPX1 may cover (or overlap) only side surfaces of the second bank patterns BP2.

The first electrode RME1 may contact a second conductive pattern CDP2 of a third conductive layer through the first contact hole CTD, in an area that overlaps part of the bank layer BNL that extends in the second direction DR2. The second electrodes RME2 may contact a second voltage line VL2 of the third conductive layer through the second contact hole CTS, in the electrode stem RM_S. As the first contact CT1 of a first insulating layer PAS1 is disposed in part of the first electrode RME1 in the subarea SA of the first subpixel SPX1, the first electrode RME1 may contact a first connecting electrode CNE1. The second electrodes RME2 may include part that protrudes from the electrode stem RM_S in the second direction DR2 to be disposed in the subarea SA of the first subpixel SPX1, and the protruding part may contact a second connecting electrode CNE2 through the second contact CT2 of the first insulating layer PAS1.

The first electrode RME1 may be disposed in separation parts ROP of the subarea SA of the first subpixel SPX1, but the second electrodes RME2 may not be disposed in the subarea SA of the first subpixel SPX1. Each of the second electrodes RME2 may include electrode stems RM_S and electrode branches (RM_B1 and RM_B2) and may generally extend in the first direction DR1 and branch off near the emission area EMA of the first subpixel SPX1. The first electrode RME1 may be disposed between the separation parts ROP of the subarea SA of the first subpixel SPX1 and may be arranged across the emission area EMA of the first subpixel SPX1.

The display device 10_3 may include, in the first subpixel SPX1, a dummy pattern DP, which is disposed in the subarea SA of the first subpixel SPX1, between two different first electrodes RME1 of two different subpixels SPXn. The dummy pattern DP may be spaced apart from the two different first electrodes RME1 by the separation parts ROP of the subarea SA of the first subpixel SPX1. Two separation parts ROP may be disposed in a subarea SA. The dummy pattern DP may be spaced apart from the first electrode RME1 of the first subpixel SPX1 by a lower separation part ROP of the subarea SA of the first subpixel SPX1 and from a first electrode RME1 of another subpixel SPXn by an upper separation part ROP of the subarea SA of the first subpixel SPX1.

The dummy pattern DP may be connected to a first voltage line VL1 of the third conductive layer through the third contact hole CTA, which penetrates a via layer VIA. The first electrode RME1 may be formed to be connected to the dummy pattern DP, and electric signals to be applied to arrange light-emitting elements ED may be applied from the first voltage line VL1 to the first electrode RME1 through the dummy pattern DP. The light-emitting elements ED may be arranged by applying signals to the first and second voltage lines VL1 and VL2 and the signals may be transmitted to the first electrode RME1 and the second electrodes RME2.

The first electrode RME1, the second electrodes RME2, and the dummy pattern DP may include a first electrode base layer RL1, second electrode base layers RL2, and an electrode base layer RL_D, respectively, a first main electrode layer RM1, second main electrode layers RM2, and a main electrode layer RM_D, respectively, and a first electrode upper layer RU1, second electrode upper layers RU2, and an electrode upper layer RU_D, respectively. The first electrode RME1 may include a first part P1 where the first main electrode layer RM1 is exposed due to the absence of the first electrode upper layer RU1, on the first bank pattern BP1. The second electrodes RME2, particularly, the first electrode branch RM_B1 of the second electrode RME2 of the first subpixel SPX1 may be disposed on the left side of the first bank pattern BP1, on one of the second bank patterns BP2, and may include a second part P2 where the second main electrode layer RM2 of the first electrode branch RM_B1 is exposed due to the absence of the second electrode upper layer RU2 of the first electrode branch RM_B1, in the emission area EMA of the first subpixel SPX1. The second electrodes RME2, particularly, the second electrode branch RM_B2 of the second electrode RME2 of the first subpixel SPX1 may be disposed on the right side of the first bank pattern BP1, on the other second bank pattern BP2, and may include a third part P3 where the second main electrode layer RM2 of the second electrode branch RM_B2 is exposed due to the absence of the second electrode upper layer RU2 of the second electrode branch RM_B2, in the emission area EMA. The light-emitting elements ED, which are positioned between the bank patterns (BP1 and BP2), may be disposed on the first part P1 of the first electrode RME1 and the second or third part P2 or P3 of the first or second electrode branch RM_B1 or RM_B2.

The first electrode upper layer RU1 may be disposed in the part of the first electrode RME1 in the subarea SA of the first subpixel SPX1, and part of the first electrode RME1 that is electrically connected to the first connecting electrode CNE1 through the first contact CT1 may be the first electrode upper layer RU1. Similarly, the second electrode upper layers RU2 may be disposed in parts of the second electrodes RME2 in the subarea SA of the first subpixel SPX1, and parts of the second electrodes RME2 that are electrically connected to the second connecting electrode CNE2 through the second contact CT2 may be the second electrode upper layers RU2. The first electrode base layer RL1 may be disposed in part of the first electrode RME1 that overlaps the bank layer BNL, and the second electrode base layers RL2 may be disposed in parts of the second electrodes RME2 that overlap the bank layer BNL. The first electrode RME1 and the second electrodes RME2 may directly contact the second conductive pattern CDP2 and the second voltage line VL2, respectively, through the first and second contact holes CTD and CTS, respectively.

The dummy pattern DP may be disposed in the subarea SA of the first subpixel SPX1 and may include the electrode base layer RL_D, the main electrode layer RM_D, and the electrode upper layer RU_D. The electrode base layer RL_D, the main electrode layer RM_D, and the electrode upper layer RU_D may be sequentially arranged in a similar manner to the first electrode base layer RL1, the first main electrode layer RM1, and the first electrode upper layer RU1 or to the second electrode base layers RL2, the second main electrode layers RM2, and the second electrode upper layers RU2. The dummy pattern DP may be connected to the first voltage line VL1 through the third contact hole CTA, which is disposed in the subarea SA of the first subpixel SPX1, and the electrode base layer RL_D of the dummy pattern DP may directly contact the first voltage line VL1.

Each of the light-emitting elements ED may be disposed on different electrodes RME, between different bank patterns (BP1 and BP2). The light-emitting elements ED may include first light-emitting elements ED1, which are disposed on the first electrode RME1 and the second electrode branch RM_B2, and second light-emitting elements ED2, which are disposed on the first electrode RME1 and the first electrode branch RM_B1. The first light-emitting elements ED1 may be disposed on the right side of the first electrode RME1, and the second light-emitting elements ED2 may be disposed on the left side of the first electrode RME1. The first light-emitting elements ED1 may be disposed on the first part P1 of the first electrode RME1 and the third part P3 of the second electrode branch RM_B2, and the second light-emitting elements ED2 may be disposed on the first part P1 of the first electrode RME1 and the second part P2 of the second electrode branch RM_B1.

The connecting electrodes CNE may include the first and second connecting electrodes CNE1 and CNE2, which are first-type connecting electrodes, and the third connecting electrode CNE3, which is a second-type connecting electrode.

The first connecting electrode CNE1 may extend in the first direction DR1 and may be disposed on the first electrode RME1. Part of the first connecting electrode CNE1 on the first bank pattern BP1 may overlap the first electrode RME1 and may extend in the first direction DR1 therefrom beyond the bank layer BNL to be disposed even in the subarea SA of the first subpixel SPX1. The first connecting electrode CNE1 may contact the first electrode RME1 through the first contact CT1, in the subarea SA.

The second connecting electrode CNE2 may extend in the first direction DR1 and may be disposed on the second electrodes RME2. Part of the second connecting electrode CNE2 on the second bank pattern BP2 may overlap the second electrodes RME2 and may extend in the second direction DR2 from the second electrodes RME2 beyond the bank layer BNL to be disposed even in the subarea SA of the first subpixel SPX1. The second connecting electrode CNE2 may contact the second electrodes RME2 through the second contact CT2, in the subarea SA.

The third connecting electrode CNE3 may include first and second extensions CN_E1 and CN_E2, which extend in the first direction DR1, and a first connector CN_B1, which connects the first and second extensions CN_E1 and CN_E2. The first extension CN_E1 may face the first connecting electrode CNE1 and may be disposed on the second electrode branch RM_B2, in the emission area EMA of the first subpixel SPX1, and the second extension CN_E2 may face the second connecting electrode CNE2 and may be disposed on the first electrode RME1, in the emission area EMA of the first subpixel SPX1. The first connector CN_B1 may extend in the second direction DR2 on part of the bank layer BNL on the lower side of the emission area EMA of the first subpixel SPX1 and may connect the first and second extensions CN_E1 and CN_E2. The third connecting electrode CNE3 may be disposed in the emission area EMA of the first subpixel SPX1 and on the bank layer BNL and may not be directly electrically connected to the electrodes RME. The second electrode branch RM_B2 below the first extension CN_E1 may be electrically connected to a second voltage line VL2, but the second power supply voltage applied to the second electrode branch RM_B2 may not be transmitted to the third connecting electrode CNE3. The first and second connecting electrodes CNE1 and CNE2 may be first-type connecting electrodes directly electrically connected to the electrodes RME, and the third connecting electrode CNE3 may be a second-type connecting electrode not electrically connected directly to the electrodes RME.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a first electrode and a second electrode disposed on a substrate to be spaced apart from each other, each of the first electrode and the second electrode including an electrode base layer, a main electrode layer disposed on the electrode base layer, and an electrode upper layer on a portion of the main electrode layer;
   a first insulating layer disposed on the first electrode and the second electrode;
   light-emitting elements disposed on the first electrode and the second electrode on the first insulating layer;
   a first connecting electrode disposed on the first electrode, the first connecting electrode being in contact with the light-emitting elements; and
   a second connecting electrode disposed on the second electrode, the second connecting electrode being in contact with the light-emitting elements,
   wherein
   the first electrode includes a first part where the electrode upper layer is not disposed on the main electrode layer,
   the second electrode includes a second part where the electrode upper layer is not disposed on the main electrode layer, and
   the light-emitting elements are disposed on the first part and the second part of the first electrode and the second electrode,
   the first insulating layer overlaps the electrode upper layer.

2. The display device of claim 1, wherein
   the main electrode layer includes aluminum (Al), and
   the electrode base layer and the electrode upper layer include titanium (Ti) or molybdenum (Mo).

3. The display device of claim 1, wherein in the first part and the second part of the first electrode and the second electrode, the main electrode layer is in direct contact with the first insulating layer.

4. The display device of claim 1, further comprising:
   a first bank pattern disposed between the first electrode and the substrate; and
   a second bank pattern disposed between the second electrode and the substrate,
   wherein
   the first part of the first electrode is disposed in part on the first bank pattern, and
   the second part of the second electrode is disposed in part on the second bank pattern.

5. The display device of claim 4, wherein the light-emitting elements are disposed on the first part and the second part, between the first bank pattern and the second bank pattern.

6. The display device of claim 1, wherein
   the first insulating layer includes a first contact exposing a part of the electrode upper layer of the first electrode, and a second contact exposing a part of the electrode upper layer of the second electrode,
   the first connecting electrode is in contact with the electrode upper layer of the first electrode through the first contact, and
   the second connecting electrode is in contact with the electrode upper layer of the second electrode through the second contact.

7. The display device of claim 6, further comprising:
an emission area where the first part and the second part are disposed on the first insulating layer, and a subarea disposed on one side of the emission area, the subarea being an area where the light-emitting elements are not disposed; and
a bank layer surrounding the subarea,
wherein
the first contact and the second contact are disposed in the subarea, and
the first connecting electrode and the second connecting electrode are disposed across the emission area and the subarea.

8. The display device of claim 1, further comprising:
a via layer disposed between the substrate and the first electrode and between the substrate and the second electrode; and
a voltage line and a conductive pattern disposed between the via layer and the substrate,
wherein portions of the first part and the second part are disposed directly on the via layer.

9. The display device of claim 8, wherein
the electrode base layer of the first electrode is in contact with the conductive pattern through a first contact hole penetrating the via layer, and
the electrode base layer of the second electrode is in contact with the voltage line through a second contact hole penetrating the via layer.

10. The display device of claim 9, further comprising:
a bank layer surrounding an emission area where the first part and the second part are disposed on the first insulating layer,
wherein the first contact hole and the second contact hole are disposed to overlap with the bank layer.

11. The display device of claim 8, wherein both sides of the main electrode layer of each of the first electrode and the second electrode are recessed inwardly from both sides of each of the electrode base layer of each of the first electrode and the second electrode and from both sides of the electrode upper layer of each of the first electrode and the second electrode.

12. The display device of claim 11, wherein
the via layer further includes a crack formed in an area where the first electrode and the second electrode are not disposed, on a top surface of the via layer, and
the first insulating layer covers the crack.

13. The display device of claim 11, wherein the first insulating layer includes an organic insulating material.

14. A display device comprising:
an emission area and a subarea disposed on one side, in a first direction, of the emission area;
a first electrode including a first electrode base layer extending in the first direction, a first main electrode layer disposed on the first electrode base layer, and a first electrode upper layer disposed on part of the first main electrode layer;
a second electrode spaced apart from the first electrode in a second direction, the second electrode including a second electrode base layer extending in the first direction, a second main electrode layer disposed on the second electrode base layer, and a second electrode upper layer disposed on part of the second main electrode layer;
a plurality of light-emitting elements disposed on the first electrode and the second electrode in the emission area;
a first connecting electrode disposed on the first electrode, the first connecting electrode being in contact with the light-emitting elements; and
a second connecting electrode disposed on the second electrode, the second connecting electrode being in contact with the light-emitting elements,
wherein
the first electrode includes a first part where the first electrode upper layer is not disposed in the emission area,
the second electrode includes a second part where the second electrode upper layer is not disposed in the emission area,
the first connecting electrode overlaps with the first part of the first electrode and is in contact with the first electrode upper layer, and
the second connecting electrode overlaps with the second part of the second electrode and is in contact with the second electrode upper layer,
the display device further comprises a bank layer including parts that extend in the first direction and parts that extend in the second direction and surrounding the emission area and the subarea, and
the first electrode and the second electrode are disposed across the emission area and the subarea.

15. The display device of claim 14, wherein
the first main electrode and the second main electrode layer include aluminum, and
the first electrode base layer, the second electrode base layer, the first electrode upper layer and the second electrode upper layer include titanium or molybdenum.

16. The display device of claim 14, further comprising:
a first bank pattern partially overlapping with the first part of the first electrode and extending in the first direction; and
a second bank pattern partially overlapping with the second electrode and extending in the first direction,
wherein the light-emitting elements are disposed between the first and second bank patterns.

17. The display device of claim 14, wherein
the first connecting electrode and the second connecting electrode are disposed across the emission area and the subarea,
the first connecting electrode is in contact with the first electrode upper layer in a first contact disposed in the subarea, and
the second connecting electrode is in contact with the second electrode upper layer in a second contact disposed in the subarea.

18. The display device of claim 14, further comprising:
a first contact hole formed in an area where the first electrode and the bank layer overlap with each other; and
a second contact hole formed in an area where the second electrode and the bank layer overlap with each other.

19. The display device of claim 14, wherein a length, in the first direction, of the first part and the second part is smaller than a length, in the first direction, of the emission area.

* * * * *